United States Patent
Shin et al.

(10) Patent No.: US 11,056,200 B2
(45) Date of Patent: *Jul. 6, 2021

(54) NONVOLATILE MEMORY DEVICE AND METHOD OF CONTROLLING INITIALIZATION OF THE SAME

(71) Applicant: SAMSUNG ELECTRONICS CO., LTD., Suwon-si (KR)

(72) Inventors: Jiyeon Shin, Hwaseong-si (KR); Sangwan Nam, Hwaseong-si (KR); Sangwon Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/012,135

(22) Filed: Sep. 4, 2020

(65) Prior Publication Data

US 2021/0035650 A1 Feb. 4, 2021

Related U.S. Application Data

(63) Continuation-in-part of application No. 16/807,405, filed on Mar. 3, 2020.

(30) Foreign Application Priority Data

Jul. 31, 2019 (KR) .................. 10-2019-0092925

(51) Int. Cl.
*G11C 7/00* (2006.01)
*G11C 16/34* (2006.01)
(Continued)

(52) U.S. Cl.
CPC .......... *G11C 16/3422* (2013.01); *G11C 16/10* (2013.01); *G11C 16/26* (2013.01);
(Continued)

(58) Field of Classification Search
CPC ..... G11C 16/26; G11C 16/0483; G11C 16/10; G11C 11/5628; G11C 11/5642;
(Continued)

(56) References Cited

U.S. PATENT DOCUMENTS 7,660,155 B2   2/2010   Byeon
7,684,242 B2   3/2010   Cha et al.
(Continued)

FOREIGN PATENT DOCUMENTS

KR    10-1212679 B1    12/2012
KR    10-1391358 B1    5/2014
KR    10-2014-0095656 A    8/2014

*Primary Examiner* — Tuan T Nguyen
(74) *Attorney, Agent, or Firm* — Sughrue Mion, PLLC

(57) ABSTRACT

Method of controlling initialization of nonvolatile memory device, where nonvolatile memory device includes memory cell region including first metal pad and peripheral circuit region including second metal pad and vertically connected to memory cell region by first and second metal pads, includes performing first sensing operation to sense write setting data stored in first memory cells in memory cell region of first memory plane and store first read setting data in first page buffer circuit in peripheral circuit region of first memory plane, performing second sensing operation to sense write setting data stored in second memory cells in memory cell region of second memory plane and store second read setting data in second page buffer circuit in peripheral circuit region of second memory plane and performing dump-down operation to store restored setting data in buffer based on first read setting data and second read setting data.

20 Claims, 31 Drawing Sheets

(51) Int. Cl.
*H01L 27/11526* (2017.01)
*H01L 27/11573* (2017.01)
*H01L 27/1157* (2017.01)
*G11C 16/26* (2006.01)
*H01L 27/11524* (2017.01)
*H01L 27/11556* (2017.01)
*G11C 16/10* (2006.01)
*H01L 27/11582* (2017.01)

(52) U.S. Cl.
CPC .... *H01L 27/1157* (2013.01); *H01L 27/11524* (2013.01); *H01L 27/11526* (2013.01); *H01L 27/11556* (2013.01); *H01L 27/11573* (2013.01); *H01L 27/11582* (2013.01)

(58) Field of Classification Search
CPC ........ G11C 16/3459; G11C 2207/2245; G11C 7/1051; G11C 11/5621; G06F 3/0659; G06F 3/0604; G06F 3/0656; G06F 3/0679
See application file for complete search history.

(56) References Cited

U.S. PATENT DOCUMENTS

| | | | |
|---|---|---|---|
| 7,826,269 B2 | 11/2010 | Kang | |
| 8,335,118 B2 | 12/2012 | Cha et al. | |
| 8,395,943 B2* | 3/2013 | Kang | ...................... G11C 16/20 365/185.18 |
| 9,196,371 B2* | 11/2015 | Yamano | .................. G11C 16/26 |
| 10,013,190 B2 | 7/2018 | Kim | |
| 2006/0050031 A1* | 3/2006 | Suzuki | ................. G09G 3/3275 345/77 |
| 2011/0038206 A1* | 2/2011 | Fujita | .................. G11C 11/5628 365/185.03 |
| 2015/0160859 A1* | 6/2015 | Kim | .................... G11C 11/5642 711/103 |

* cited by examiner

FIG. 19

| RSD1 | A1 | A2 | A3 | A4 | A5 | A6 | A7 | A8 | A9 | A10 |

| RSD2 | B1 | B2 | B3 | B4 | B5 | B6 | B7 | B8 | B9 | B10 |

FIG. 25

| RSD1 | A1 | A2 | A3 | A4 | A5 | A6 | A7 | A8 | A9 | A10 |
|---|---|---|---|---|---|---|---|---|---|---|

| RSD2 | B1 | B2 | B3 | B4 | B5 | B6 | B7 | B8 | B9 | B10 |
|---|---|---|---|---|---|---|---|---|---|---|

| RSD3 | C1 | C2 | C3 | C4 | C5 | C6 | C7 | C8 | C9 | C10 |
|---|---|---|---|---|---|---|---|---|---|---|

| RSD4 | D1 | D2 | D3 | D4 | D5 | D6 | D7 | D8 | D9 | D10 |
|---|---|---|---|---|---|---|---|---|---|---|

NONVOLATILE MEMORY DEVICE AND METHOD OF CONTROLLING INITIALIZATION OF THE SAME

CROSS-REFERENCE TO RELATED APPLICATION

This application is a continuation-in-part application of U.S. application Ser. No. 16/807,405 filed on Mar. 3, 2020, which claims priority under 35 USC § 119 to Korean Patent Application No. 10-2019-0092925, filed on Jul. 31, 2019, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a nonvolatile memory device and a method of controlling initialization of a nonvolatile memory device.

2. Description of the Related Art

A nonvolatile memory device such as a flash memory device, a resistive memory device, etc. may store data by programming each memory cell to have one of a threshold voltage distribution or a resistance distribution corresponding to different logic states. Initialization of the nonvolatile memory device may include a procedure of moving setting data stored from the nonvolatile memory device to another memory component. Three-dimensional nonvolatile memory devices such as a vertical NAND flash memory device are developed to increase an integration degree of memory cells. As the integration degree and the memory capacity of the nonvolatile memory device are increased, a time for initializing the nonvolatile memory device increases.

SUMMARY

It is an aspect to provide a nonvolatile memory device and a method of controlling initialization of a nonvolatile memory device, capable of performing initialization efficiently.

According to an aspect of one or more example embodiments, there is provided a method of controlling initialization of a nonvolatile memory device, where the nonvolatile memory device includes a memory cell region including a first metal pad and a peripheral circuit region including a second metal pad and vertically connected to the memory cell region by the first metal pad and the second metal pad. The method includes performing a first sensing operation to sense write setting data stored in first memory cells in the memory cell region of a first memory plane and store first read setting data in a first page buffer circuit in the peripheral circuit region of the first memory plane, performing a second sensing operation to sense the write setting data stored in second memory cells in the memory cell region of a second memory plane and store second read setting data in a second page buffer circuit of in the peripheral circuit region the second memory plane and performing a dump-down operation to store restored setting data corresponding to the write setting data in a buffer based on the first read setting data and the second read setting data.

According to another aspect of one or more example embodiments, there is provided a method of controlling initialization of a nonvolatile memory device, where the nonvolatile memory device includes a memory cell region including a first metal pad and a peripheral circuit region including a second metal pad and vertically connected to the memory cell region by the first metal pad and the second metal pad. The method includes performing a first sensing operation to sense write setting data stored first memory cells in the memory cell region of a first memory plane and store first read setting data in a first page buffer circuit in the peripheral circuit region of the first memory plane, performing a second sensing operation to sense the write setting data stored in second memory cells in the memory cell region of a second memory plane and store second read setting data in a second page buffer circuit in the peripheral circuit region of the second memory plane, verifying validity of each of a plurality of first data units using a first verification circuit connected to the first page buffer circuit, the plurality of first data units corresponding to the first read setting data divided by a unit bit number, verifying validity of each of a plurality of second data units using a second verification circuit connected to the second page buffer circuit, the plurality of second data units corresponding to the second read setting data divided by the unit bit number, selectively enabling the first verification circuit and the second verification circuit based on a validity verification result of each of the plurality of first data units and a validity verification result of each of the plurality of second data units and storing a valid data unit corresponding to one of the first data unit and the second data unit in a buffer based on the validity verification result of each of the plurality of first data units and the validity verification result of each of the plurality of second data units.

According to yet another aspect of one or more example embodiments, there is provided a nonvolatile memory device including a memory cell region including a first metal pad, a peripheral circuit region including a second metal pad and vertically connected to the memory cell region by the first metal pad and the second metal pad, a first memory plane including first memory cells in the memory cell region storing write setting data and a first page buffer circuit in the peripheral circuit region storing first read setting data sensed from the first memory cells, a second memory plane including second memory cells in the memory cell region storing the write setting data and a second page buffer circuit in the peripheral circuit region storing second read setting data sensed from the second memory cells, a first verification circuit connected to the first page buffer circuit, the first verification circuit configured to verify validity of the first read setting data, a second verification circuit connected to the second page buffer circuit, the second verification circuit configured to verify validity of the second read setting data, a dump-down control logic configured to determine valid data corresponding one of the first read setting data and the second read setting data based on a validity verification result of the first read setting data and a validity verification result of the second read setting data and a buffer configured to store the valid data provided from the dump-down control logic.

BRIEF DESCRIPTION OF THE DRAWINGS

Example embodiments of the present disclosure will be more clearly understood from the following detailed description taken in conjunction with the accompanying drawings, in which:

FIG. 19 is a diagram illustrating an example of a read setting data sensed from a nonvolatile memory device according to example embodiments;

FIG. 25 is a diagram illustrating an example of a read setting data sensed from a nonvolatile memory device according to example embodiments;

DETAILED DESCRIPTION

Figure 1:
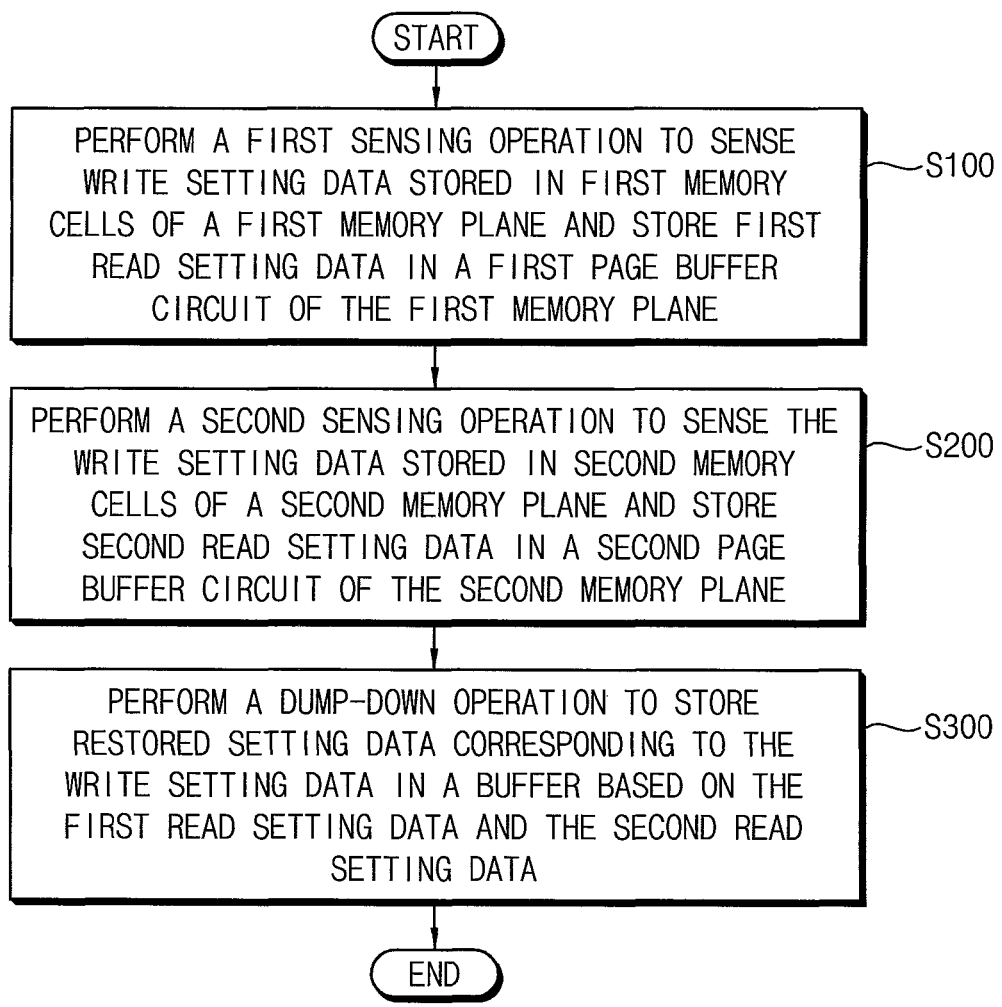
FIG. 1 is a flow chare illustrating a method of controlling initialization of a nonvolatile memory device according to example embodiments.

Various example embodiments will be described more fully hereinafter with reference to the accompanying drawings, in which some example embodiments are shown. In the drawings, like numerals refer to like elements throughout. The repeated descriptions may be omitted for conciseness.

The nonvolatile memory device and the method of controlling initialization of a nonvolatile memory device according to various exemplary embodiments may reduce a time of a dump-down sequence and an entire initialization time for initializing the nonvolatile memory device by reading out the multiple write setting data in parallel and verifying validity of the multiple read setting data with a complementary scheme.

In addition, the nonvolatile memory device and the method of controlling initialization of a nonvolatile memory device according to various exemplary embodiments may reduce a probability of a dump-down failure and enhance performance of the nonvolatile memory device by reading out the multiple write setting data in parallel and verifying validity of the multiple read setting data with the complementary scheme FIG. 1 is a flow chare illustrating a method of controlling initialization of a nonvolatile memory device according to example embodiments.

Referring to FIG. 1, a first sensing operation is performed to sense write setting data stored in first memory cells of a first memory plane and store first read setting data in a first page buffer circuit of the first memory plane (S100).

A second sensing operation is performed to sense the write setting data stored in second memory cells of a second memory plane and store second read setting data in a second page buffer circuit of the second memory plane (S200).

A dump-down operation is performed to store restored setting data corresponding to the write setting data in a buffer based on the first read setting data and the second read setting data (S300).

Setting data includes information for initialization of the nonvolatile memory device, which may be referred to as information data read (IDR) data. The same setting data may be stored in a plurality of memory regions of the nonvolatile memory device. Hereinafter, the setting data that are to be stored in the memory region may be referred to as write setting data, and the setting data that are provided by reading out the stored write setting data may be referred to as read setting data. Even though the same setting data are stored in the plurality of memory regions, the read setting data may be distorted and different from the write setting data due to deviation of a program operation, deviations of a read operation, degeneration of the memory cells, and so on. Accordingly, when the read setting data from one memory region has uncorrectable errors, the read setting data may be loaded from another memory region.

A copy scheme of the setting data is different depending on products. In general, the setting data may include plane replica data for correcting bitline defects and a string selection line (SSL) replica data for correcting SSL defects.

An initialization sequence or an IDR sequence may include "sensing" to read out the setting data from the memory cells to a page buffer circuit, "dump-down" to verify validity of the data stored in the page buffer circuit and store valid setting data in a buffer, and "following processes" to set operation conditions of the nonvolatile memory device based on the valid setting data in the buffer. For example, the "following processes" may include setting of levels of operation voltages, a WOR scan to exclude failed columns from a pass/fail operation, and so on.

A booting time of a product is affected directly by the initialization time and it is important to reduce the initialization time or the IRD time, it is advantageous to perform the dump-down sequence efficiently because the dump-down sequence occupies most of the initialization time.

According to example embodiments, the multiple write setting data are read out from the multiple memory regions in parallel and the dump-down operation is performed using the multiple read setting data with a complementary scheme such that if the verification operation of one read setting data is failed, another read setting data may be used.

In an example product using 16 kilo-byte (KB) as one page, the setting data is about 2300 bytes. If any bit among the 2300 bytes is determined as an invalid bit, the entire setting data is invalidated, and the sensing operation and the dump-down operation have to be repeated based on the setting data stored in other memory regions. In the related art scheme, the dump-down operation proceeds to the last bit of the setting data without storing the invalid bits. If the setting data stored in the buffers has an error, the buffer is reset and the same operation is repeated based on the setting data stored in other memory regions.

The amount of the setting data will be increased according to increase of an integration degree and a memory capacity of a nonvolatile memory device, and thus the initialization time will be increased in proportion with the amount of the setting data. Particularly in cases of the products adopting a plane independent read (PIR) scheme or a plane independent core (PIC) scheme, the amount of the setting data is further increased due to per-plane setting.

The nonvolatile memory device and the method of controlling initialization of a nonvolatile memory device according to various example embodiments may reduce a time of a dump-down sequence and an entire initialization time for initializing the nonvolatile memory device by reading out the multiple write setting data in parallel and verifying validity of the multiple read setting data with a complementary scheme. In addition, the nonvolatile memory device and the method of controlling initialization of a nonvolatile memory device according to various example embodiments may reduce a probability of a dump-down failure and enhance performance of the nonvolatile memory device by reading out the multiple write setting data in parallel and verifying validity of the multiple read setting data with the complementary scheme.

Figure 2:
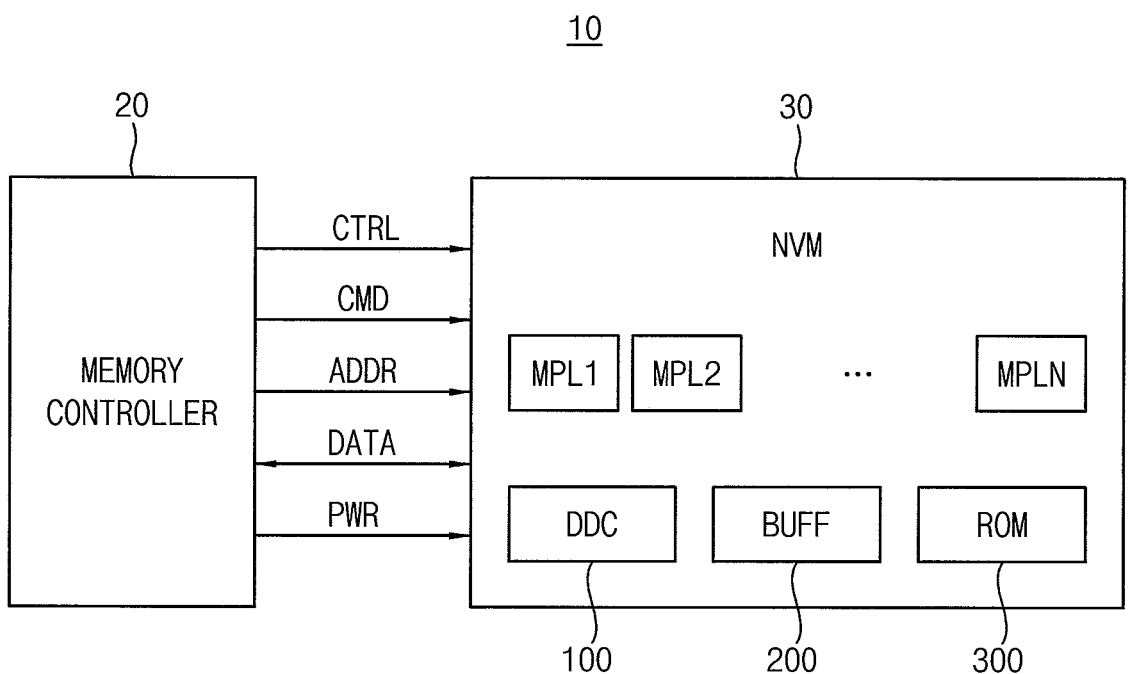
FIG. 2 is a block diagram illustrating a memory system according to example embodiments.

FIG. 2 is a block diagram illustrating a memory system according to example embodiments.

Referring to FIG. 2, a memory system 10 may include a memory controller 20 and a nonvolatile memory device (NVM) 30. The nonvolatile memory device 30 may include a plurality of memory planes MPL1~MPLN, and a memory system 10 of FIG. 2 may be a memory card, a universal serial bus (USB) memory, a solid state drive (SSD), and the like.

The nonvolatile memory device 30 may perform a read operation, an erase operation, and a program operation or a write operation under control of the memory controller 20. The nonvolatile memory device 30 may receive a command CMD, an address ADDR and data DATA through input/output lines from the memory controller 20 for performing the read operation, the erase operation, and the program operation or the write operation. In addition, the nonvolatile memory device 30 may receive a control signal CTRL through a control line from the memory controller 20 and receive a power PWR through a power line from the memory controller 20.

The nonvolatile memory device 30 may include a dump-down circuit DDC 100, a buffer BUFF 200 and a ROM 300. The dump-down circuit 100 may be configured to perform the method of controlling initialization of a nonvolatile memory device as described with reference to FIG. 1. The buffer memory 200 may be implemented with a volatile memory to store data used in various operations of the nonvolatile memory device 30. The ROM 300 may store data to be maintained after the nonvolatile memory device 30 is powered off.

Figure 3:
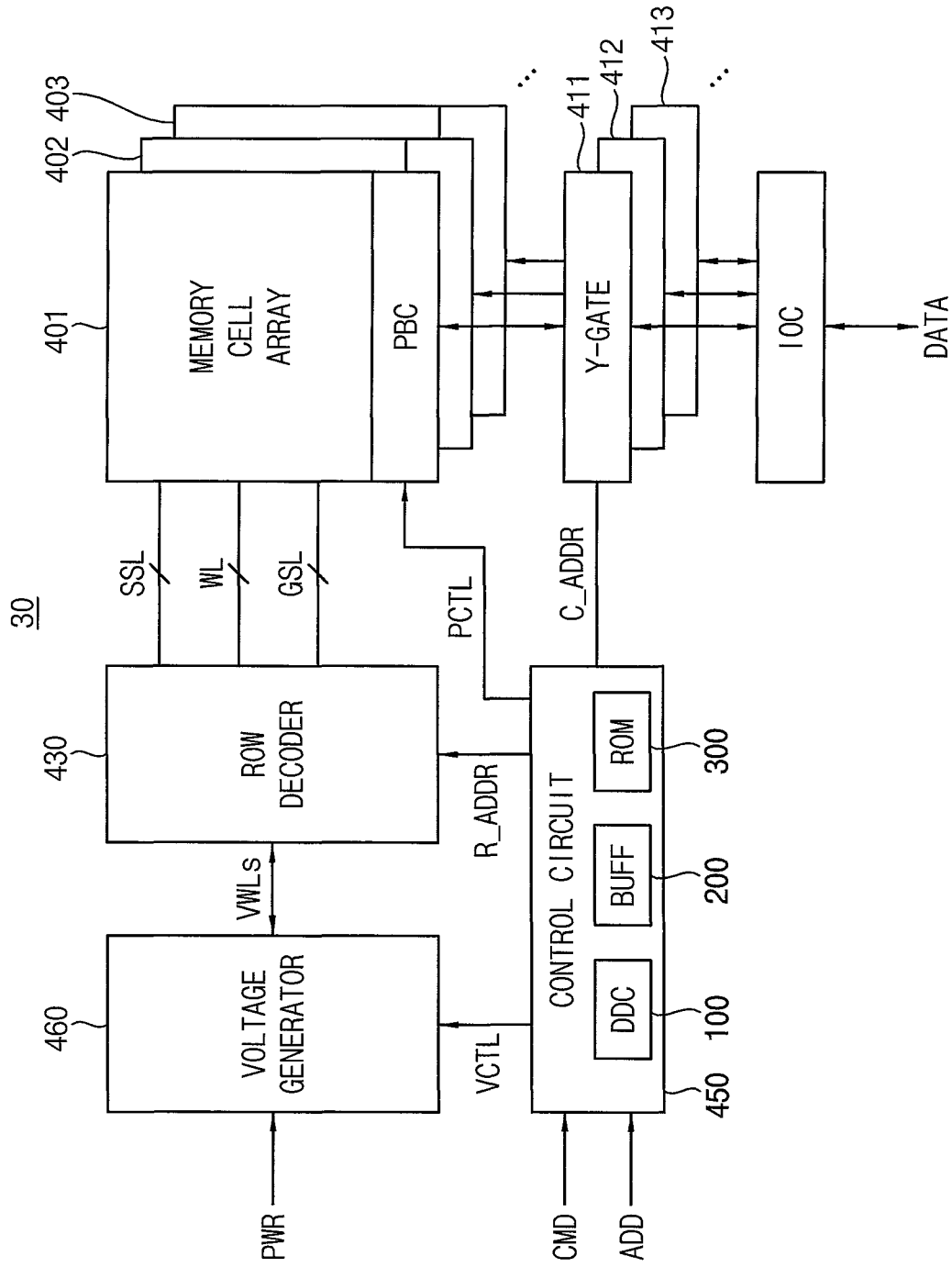
FIG. 3 is a block diagram illustrating a nonvolatile memory device according to example embodiments.

FIG. 3 is a block diagram illustrating a nonvolatile memory device according to example embodiments.

Referring to FIG. 3, a nonvolatile memory device 30 may include a plurality of memory planes 401, 402 and 403, each including a respective memory cell array and a page buffer circuit PBC. The nonvolatile memory device 30 may also include a row decoder 430, a plurality of column gates Y-GATE 411, 412 and 413, a data input-output circuit IOC, a control circuit 450, and a voltage generator 460.

Each memory cell array may be coupled to the row decoder 430 through a plurality of string selection lines SSL, a plurality of word lines WL, and a plurality of ground selection lines GSL. In addition, each memory cell array may be coupled to the respective page buffer circuit PBC through a plurality of bitlines (not shown). Each memory cell array may include a plurality of memory cells coupled to the plurality of word lines WL and the plurality of bitlines (described in more detail later). In some example embodiments, the memory cell array may be a three-dimensional memory cell array, which may be formed on a substrate in a three-dimensional structure (or a vertical structure). In some example embodiments, each memory cell array may include a plurality of NAND strings or a plurality of cell strings that are vertically oriented such that at least one memory cell is located over another memory cell.

The control circuit 450 may receive a command (signal) CMD and an address (signal) ADD from the memory controller 20 in FIG. 2 and control erasing, programming, writing, and/or reading operations of the nonvolatile memory device 30 based on the command signal CMD and the address signal ADD. An erasure operation may comprise performing a sequence of erase loops, and a program operation may include performing a sequence of program loops. Each program loop may include a program period and a program verification period. Each erase loop may include an erase period and an erase verification period. The read operation may include a normal read operation and data recover read operation.

Based on the command signal CMD, the control circuit 450 may generate the control signals VCTL, which are used for controlling the voltage generator 460, and may generate the page buffer control signal PCTL for controlling the page buffer circuit PBC. Based on the address signal ADD, the control circuit 450 may generate the row address R_ADDR and the column address C_ADDR. The control circuit 450 may provide the row address R_ADDR to the row decoder 430 and provide the column address C_ADDR to the column gates 411, 412 and 413. The row decoder 430 may be coupled to the memory cell array through the plurality of string selection lines SSL, the plurality of word lines WL, and the plurality of ground selection lines GSL.

During the program operation or the read operation, the row decoder 430 may determine that one of the word lines WL is a selected word line and determine that the rest of the word lines WL except for the selected word line are unselected word lines based on the row address R_ADDR.

In addition, during the program operation or the read operation, the row decoder 430 may determine that one of the string selection lines SSL is a selected string selection line and determine that the rest of the string selection lines SSL except for the selected string selection line are unselected string selection lines based on the row address R_ADDR.

The voltage generator 460 may generate word line voltages VWLs, which may be required for the operation of the memory cell array of the nonvolatile memory device 30, based on the control signals VCTL. The voltage generator 460 may receive the power from the memory controller 20. The word line voltages VWLs may be applied to the word lines WL through the row decoder 430.

For example, during the program operation, the voltage generator 460 may apply a program voltage to the selected word line and may apply a program pass voltage to the unselected word lines. In addition, during the program verification operation, the voltage generator 460 may apply a program verification voltage to the selected word line and may apply a verification pass voltage to the unselected word lines.

In addition, during the normal read operation, the voltage generator 460 may apply a read voltage to the selected word line and may apply a read pass voltage to the unselected word lines. During the data recover read operation, the voltage generator 460 may apply the read voltage to a word line adjacent to the selected word line and may apply a recover read voltage to the selected word line.

Each page buffer circuit PBC may be coupled to the memory cell array through the bitlines. The page buffer circuit PBC may include a plurality of page buffers. In some example embodiments, each page buffer may be connected to only one bit line. In other example embodiments, each page buffer may be connected to two or more bitlines. The page buffer circuit PBC may temporarily store data to be programmed in a selected page or data read out from the selected page of the memory cell array 100.

Each of the data input-output circuit IOC may be coupled to the corresponding page buffer circuit PBC through data lines. During the program operation, the data input-output circuit IOC may receive program data DATA received from the memory controller 20 and provide the program data DATA to the page buffer circuit PBC based on the column address C_ADDR received from the control circuit 450. During the read operation, the data input-output circuit may provide read data DATA, having been read from the memory cell array and stored in the page buffer circuit PBC, to the memory controller 20 based on the column address C_ADDR received from the control circuit 450.

The control circuit 450 may include the dump-down circuit DDC 100, the buffer BUFF 200 and the ROM 300. The dump-down circuit 100 may be configured to perform the method of controlling initialization of a nonvolatile memory device as described with reference to FIG. 1. The buffer memory 200 may be implemented with a volatile memory to store data required by the nonvolatile memory device 30. The ROM 300 may store data to be maintained after the nonvolatile memory device 30 is powered off. Even though FIG. 3 illustrates that the dump-down circuit 100, the buffer 200 and the ROM 300 are included in the control circuit 450, at least one of the dump-down circuit 100, the buffer 200 or the ROM 300 may be implemented as a component distinct from the control circuit 450.

Figure 4:
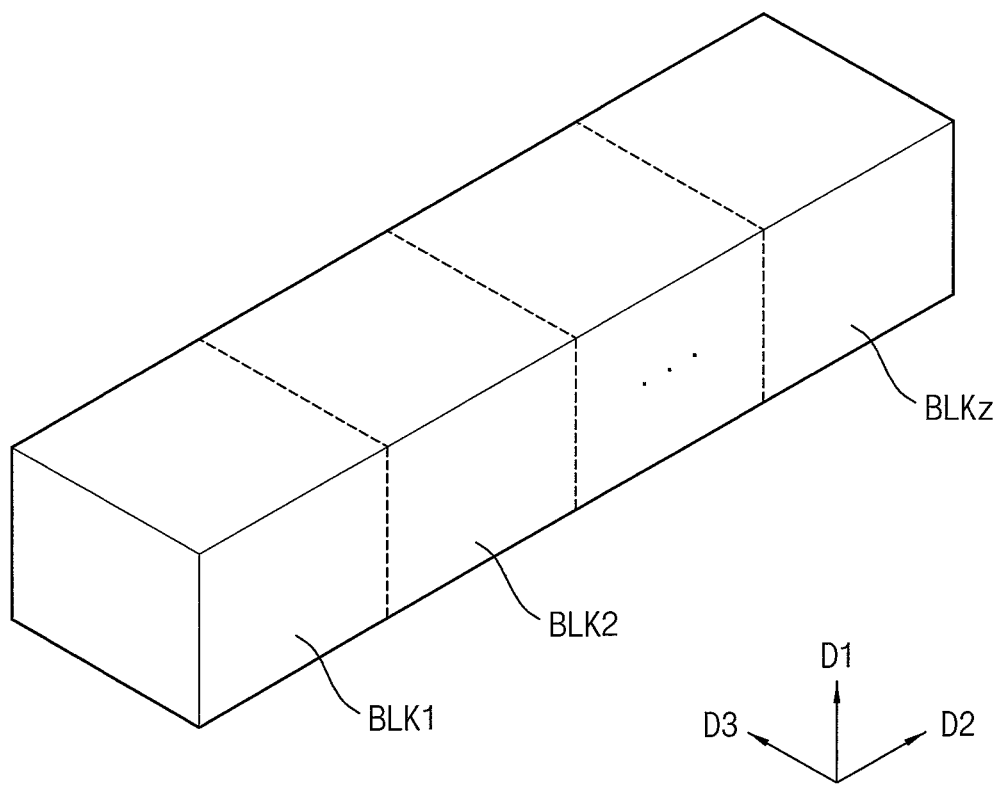
FIG. 4 is a block diagram illustrating an example of a memory cell array included in the nonvolatile memory device of FIG. 3, according to example embodiments.
Figure 5:
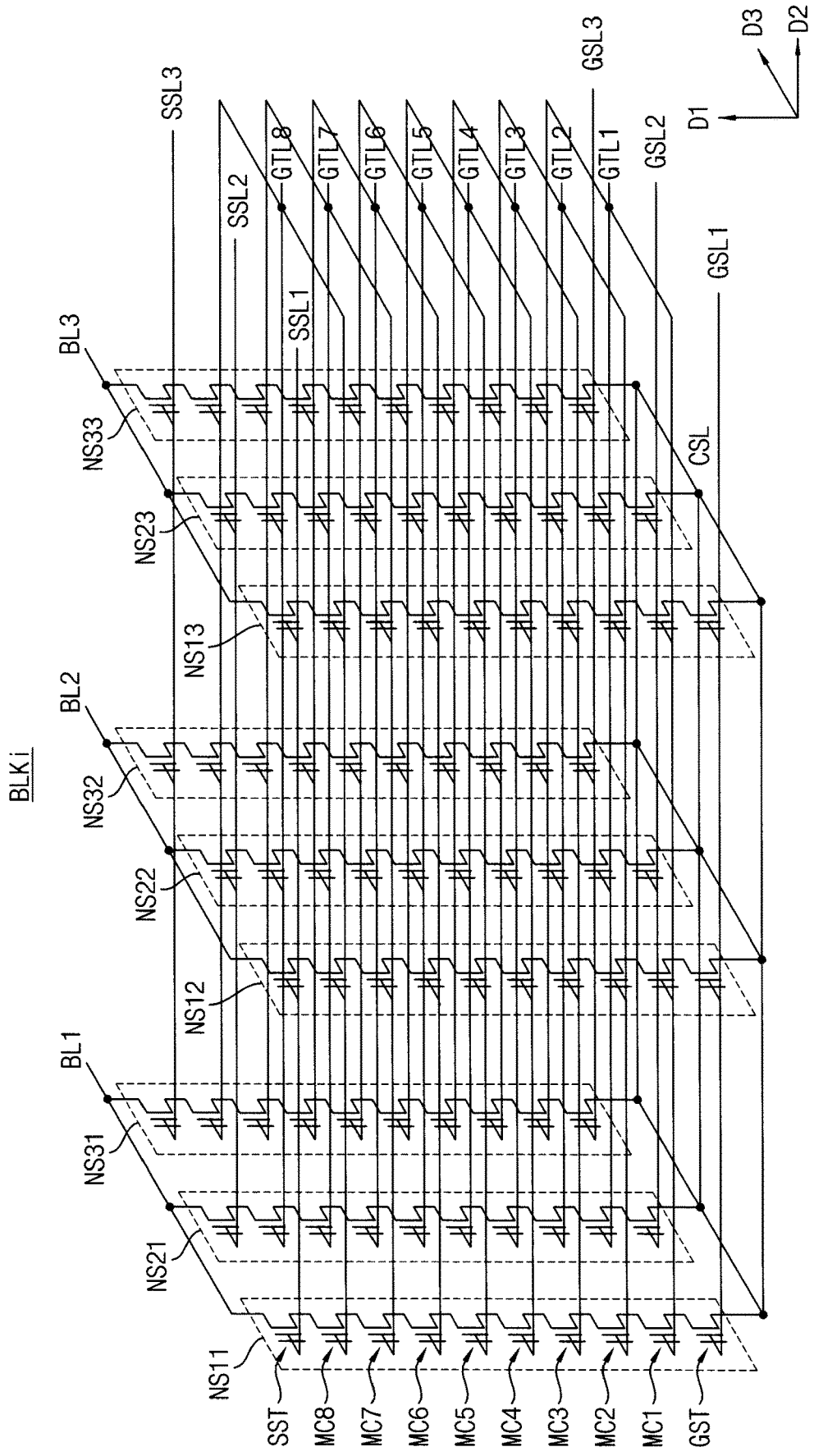
FIG. 5 is a circuit diagram illustrating an equivalent circuit of a memory block in FIG. 4.

FIG. 4 is a block diagram illustrating an example of a memory cell array included in the nonvolatile memory device of FIG. 3, and FIG. 5 is a circuit diagram illustrating an equivalent circuit of a memory block in FIG. 4.

As illustrated in FIG. 4, the memory cell array 401 may include a plurality of memory blocks BLK1 to BLKz. The memory blocks BLK1 to BLKz are selected by the row decoder 430 in FIG. 3. For example, the row decoder 430 may select a particular memory block BLK corresponding to a block address among the memory blocks BLK1 to BLKz.

The memory block BLKi of FIG. 5 may be formed on a substrate in a three-dimensional structure (or a vertical structure). For example, a plurality of NAND strings or cell strings included in the memory block BLKi may be formed in a first direction D1 perpendicular to a second direction D2 and a third direction D3, that is, perpendicular to the upper surface of the substrate.

Referring to FIG. 5, the memory block BLKi includes NAND strings NS11 to NS33 coupled between bitlines BL1, BL2 and BL3 and a common source line CSL. Each of the NAND strings NS11 to NS33 includes a string selection transistor SST, a plurality of memory cells MC1 to MC8, and a ground selection transistor GST. In FIG. 5, each of the NAND strings NS11 to NS33 is illustrated to include eight memory cells MC1 to MC8. However, example embodiments are not limited thereto. In some example embodiments, each of the NAND strings NS11 to NS33 may include any number of memory cells.

Each string selection transistor SST may be connected to a corresponding string selection line (one of SSL1 to SSL3). The plurality of memory cells MC1 to MC8 may be connected to the plurality of gate lines GTL1 to GTL8, respectively. The gate lines GTL1 to GTL8 may be wordlines and some of the gate lines GTL1 to GTL8 may be dummy wordlines. Each ground selection transistor GST may be connected to a corresponding ground selection line (one of GSL1 to GSL3). Each string selection transistor SST may be connected to a corresponding bitline (e.g., one of BL1, BL2 and BL3), and each ground selection transistor GST may be connected to the common source line CSL.

Wordlines (e.g., WL1) having the same height (i.e., level) may be commonly connected, and the ground selection lines GSL1 to GSL3 and the string selection lines SSL1 to SSL3 may be separated. In FIG. 5, the memory block BLKi is illustrated to be coupled to eight gate lines GTL1 to GTL8 and three bitlines BL1 to BL3. However, example embodiments are not limited thereto.

Figure 6:
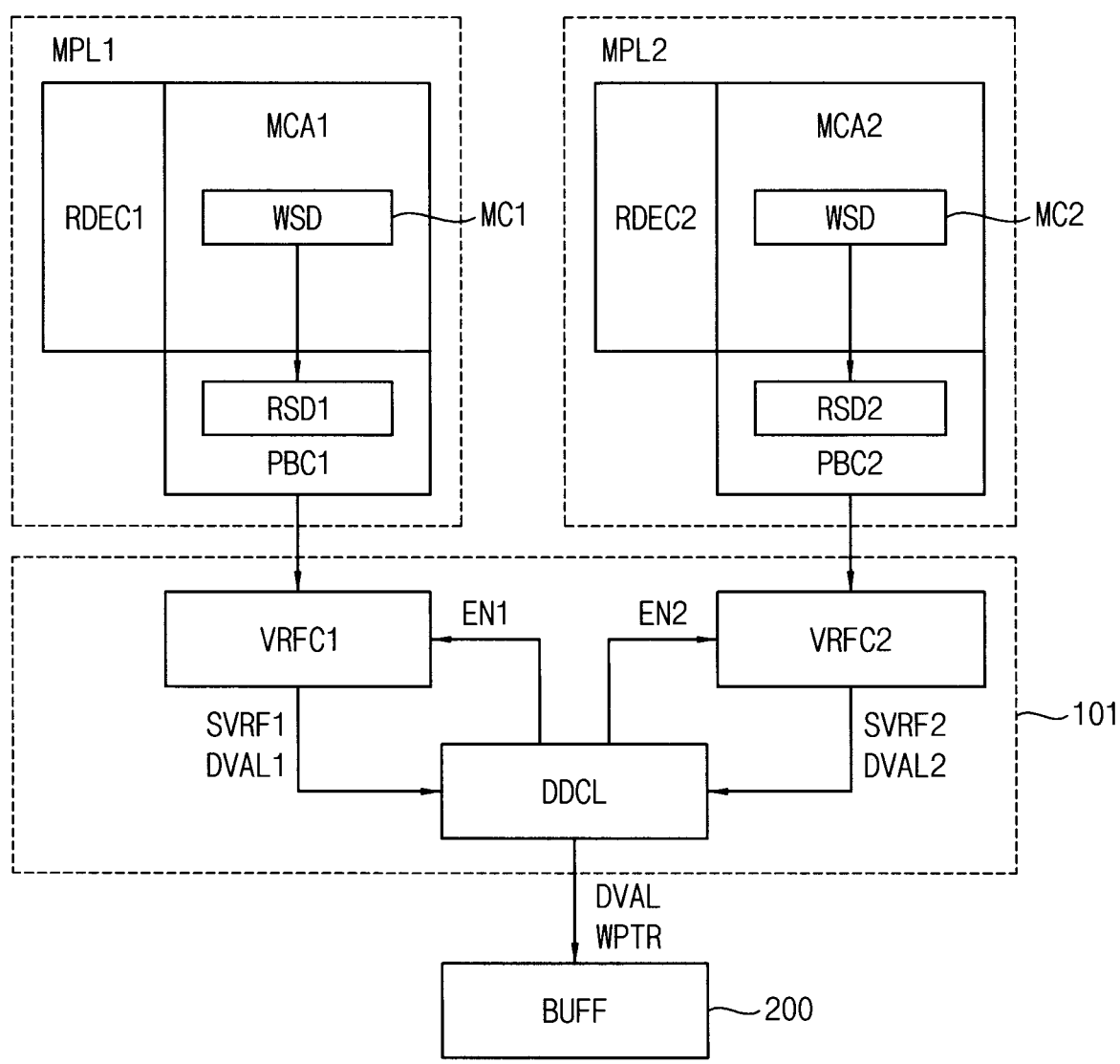
FIG. 6 is a diagram illustrating a nonvolatile memory device according to example embodiments.

FIG. 6 is a diagram illustrating a nonvolatile memory device according to example embodiments. For convenience of illustration and description, only the components related with a method of controlling initialization of a nonvolatile memory device are illustrated in FIG. 6. Hereinafter, the descriptions repeated with FIGS. 3, 4 and 5 may be omitted for conciseness.

Referring to FIG. 6, a nonvolatile memory device 11 may include a first memory plane MPL1, a second memory plane MPL2, a dump-down circuit 101 and a buffer 200.

The data may be stored in or read from the first memory plane MPL1 and the second memory plane MPL2 under control of the control circuit 450 in FIG. 3. Each of the first memory plane MPL1 and the second memory plane MPL2 may be divided into a region for storing write setting data WSD and a region for storing user data. The write setting data WSD may include information for initialization such as DC information, option information, repair information, bad block information, and so on.

The first memory plane MPL1 may include a first memory cell array MCA1, a first row decoder RDEC1 and a first page buffer circuit PBC1. In the write operation, the first row decoder RDEC1 selects one wordline of the first memory cell array MCA1. The first page buffer circuit PBC1 transfers the data to the first memory cell array MCA1 through bitlines to store the data in the memory cells connected to the selected wordline. In the read operation, the first row decoder RDEC1 selects one wordline of the first memory cell array MCA1 and the first page buffer circuit PBC1 senses and stores the data stored in the memory cells connected to the selected wordline.

The second memory plane MPL2 may include a second memory cell array MCA2, a second row decoder RDEC2 and a second page buffer circuit PBC2. In the write operation, the second row decoder RDEC2 selects one wordline of the second memory cell array MCA2. The second page buffer circuit PBC2 transfers the data to the second memory cell array MCA2 through bitlines to store the data in the memory cells connected to the selected wordline. In the read operation, the second row decoder RDEC2 selects one wordline of the second memory cell array MCA2 and the second page buffer circuit PBC2 senses and stores the data stored in the memory cells connected to the selected wordline.

In this way, the write setting data WSD may be stored in first memory cells MC1 of the first memory plane MPL1 and second memory cells MC2 of the second memory plane MPL2. After that, for example during a booting operation of the nonvolatile memory device 11, a first sensing operation may be performed to sense the write setting data WSD stored in the first memory cells MC1 and store first read setting data RSD1 in the first page buffer circuit PBC1, and a second sensing operation may be performed to sense the write setting data WSD stored in the second memory cells MC2 and store second read setting data RSD2 in the second page buffer circuit PBC2.

When power is supplied to a system including the nonvolatile memory device 11, an initialization operation of the nonvolatile memory device 11 may be performed. The control circuit 450 in FIG. 3 may receive a power-on signal and perform the first sensing operation and the second sensing operation in response to the power-on signal to store the first read setting data RSD1 and the second read setting data RSD2 in the first page buffer circuit PBC1 and the second page buffer circuit PBC2, respectively.

Even though FIG. 6 illustrates the two memory planes for convenience of illustration and description, the nonvolatile memory device 11 may include three or more memory planes or mats.

The dump-down circuit 101 may include a first verification circuit VRFC1, a second verification circuit VRFC2 and a dump-down control logic DDCL.

The first verification circuit VRFC1 is connected to the first page buffer circuit PBC1. The first verification circuit VRF1 may verify validity of the first read setting data RSD1 to provide a first verification signal SVRF1 and first valid data DVAL1. The second verification circuit VRFC2 is connected to the second page buffer circuit PBC2. The second verification circuit VRFC2 may verify validity of the second read setting data RSD2 to provide a second verification signal SVRF2 and second valid data DVAL2.

The dump-down control logic DDCL may determine valid data DVAL corresponding to one of the first read setting data RSD1 and the second read setting data RSD2 based on a validity verification result of the first read setting data RSD1 and a validity verification result of the second read setting data RSD2. The validity verification result of the first read setting data RSD1 and the validity verification result of the second read setting data RSD2 may be represented by logic levels of the first verification signal SVRF1 and the second verification signal SVRF2, respectively. The valid data DVAL may correspond to one of the first valid data DVAL1 and the second valid data DVAL2. Also the dump-down control logic DDCL may provide a write pointer or a write address indicating a position of the buffer 200 corresponding to the valid data DVAL presently provided to the buffer 200.

The dump-down control logic DDCL may generate a first enable signal EN1 and a second enable signal EN2 based on the first verification signal SVRF1 and the second verification signal SVRF2. The first verification circuit VRFC1 may be enabled in response to activation of the first enable signal EN1 and the second verification circuit VRFC2 may be enabled in response to activation of the second enable signal EN2.

Figure 7:
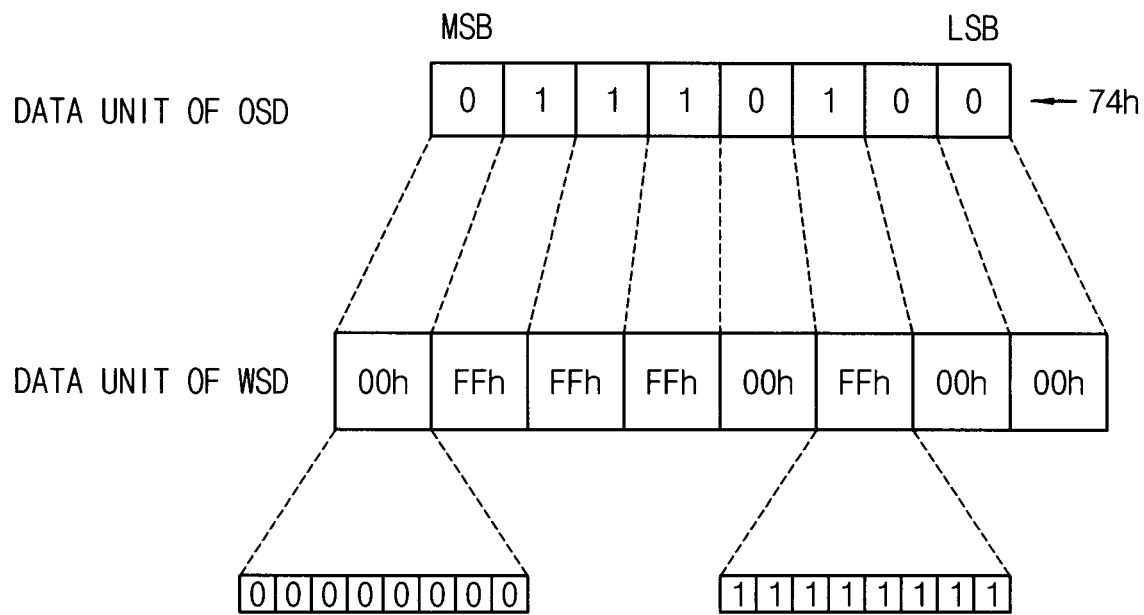
FIGS. 7, 8 and 9 are diagrams for describing example embodiments of a verification operation applicable to a method of controlling initialization of a nonvolatile memory device according to example embodiments.
Figure 8:
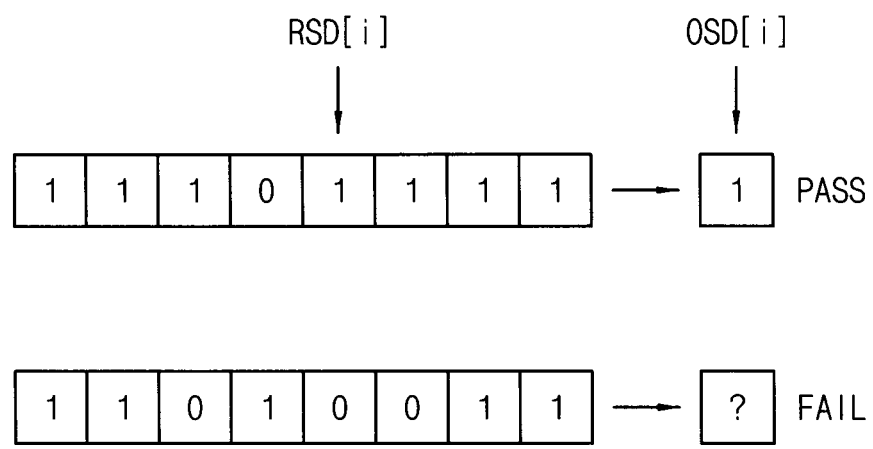
Figure 9:
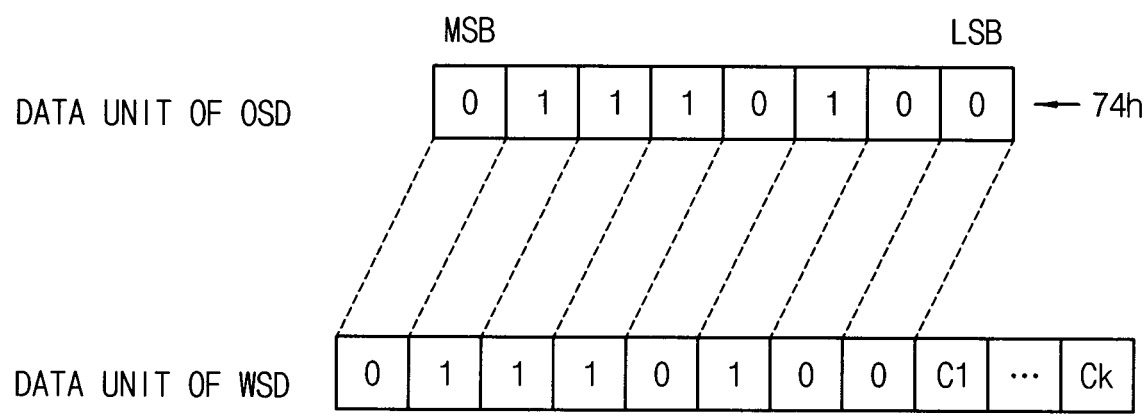

FIGS. 7, 8 and 9 are diagrams for describing example embodiments of a verification operation applicable to a method of controlling initialization of a nonvolatile memory device according to example embodiments. FIGS. 7, 8 and 9 illustrate only one data unit of original setting data OSD and write setting data WSD for convenience of illustration and description. It would be understood that the original setting data OSD and the write setting data WSD may include a plurality of data units.

In the initialization sequence of the nonvolatile memory device, the setting data stored in the memory cells is read out, verified and stored in the buffer. The column repair information is reflected in the WOR scan stage as described above, and the column defects have to be overcome by another scheme during the dump-down operation. To overcome the column defects, the write setting data WSD may be obtained by copying each bit of the original setting data OSD into a plurality of replica bits, and the write setting data WSD having the replica bits may be stored in the nonvolatile memory device. In this case, each of the first verification circuit VRFC1 and the second verification circuit VRFC2 in FIG. 6 may include a majority voter circuit configured to determine whether a number of bits having an equal value among the plurality of replica bits corresponding to each bit of the original setting data OSD is equal to or greater than a reference number.

For example, as illustrated in FIG. 7, each bit of the original setting data OSD (e.g., of 8 bits of OSD shown in the example of FIG. 7) may be copied and extended to eight replica bits to form the write setting data WSD. The WSD is written, and then read as the RSD shown in FIG. 8. The eights bits corresponding to each bit RSD[i] of the read setting data RSD may be compared with the reference number. For example, if the reference number is set to be six, each bit RSD[i] may be determined as being valid (PASS) when six or more bits among the eight replica bits coincide, and each bit RSD[i] may be determined as being invalid (FAIL) when the five or fewer bits among the eight replica bits coincide. For example, assuming that replica bits of FFh shown in FIG. 7 is written as the WSD and then read as the RSD[i] shown in FIG. 8, the top data shows a valid (PASS) RSD[i] since only one bit is a zero 0. The bottom data shows an invalid (FAIL) RSD[i] since three bits are zero 0. In other words, in the top data, it may be determined that the OSD[i] was 1, whereas in the bottom data it cannot be determined that the OSD[i] was 1.

As another example of the verification operation, FIG. 9 illustrates an example embodiment in which parity bits C1~Ck of a cyclic redundancy check (CRC) scheme are used. The CRC scheme is known, and the detailed description thereof is omitted for conciseness. In this case, each of the first verification circuit VRFC1 and the second verification circuit VRFC2 may verify validity of the first read setting data RSD1 and the second read setting data RSD2 using the CRC parity bits.

Figure 10:
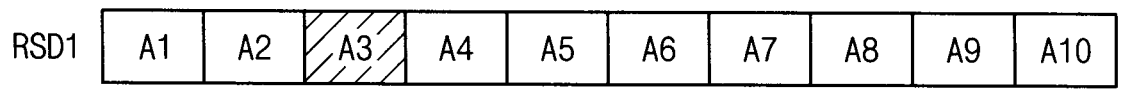
FIG. 10 is a diagram illustrating an example of a read setting data sensed from a nonvolatile memory device according to example embodiments.
Figure 10:
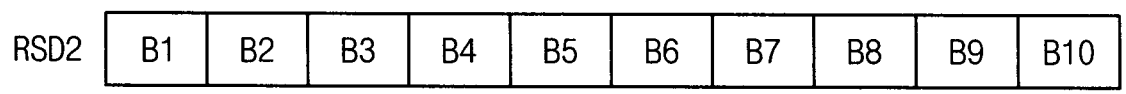

FIG. 10 is a diagram illustrating an example of a read setting data sensed from a nonvolatile memory device according to example embodiments.

Referring to FIG. 10, the first read setting data RSD1 may include a plurality of first data units A1~A10 divided by a unit bit number, and the second read setting data RSD2 may include a plurality of second data units B1~B10 divided by the unit bit number. FIG. 10 illustrates for convenience of illustration and description that each of the first read setting data RSD1 and the second read setting data RSD2 includes ten data units, but example embodiments are not limited thereto. An invalid data unit having uncorrectable errors may be represented to be hatched. FIG. 10 illustrates an example that the first data unit A3 of the first read setting data RSD1 is the invalid data unit.

FIGS. 11 through 18 are diagrams illustrating example embodiments of a method of controlling initialization of a nonvolatile memory device corresponding to the read setting data of FIG. 10.

Figure 11:
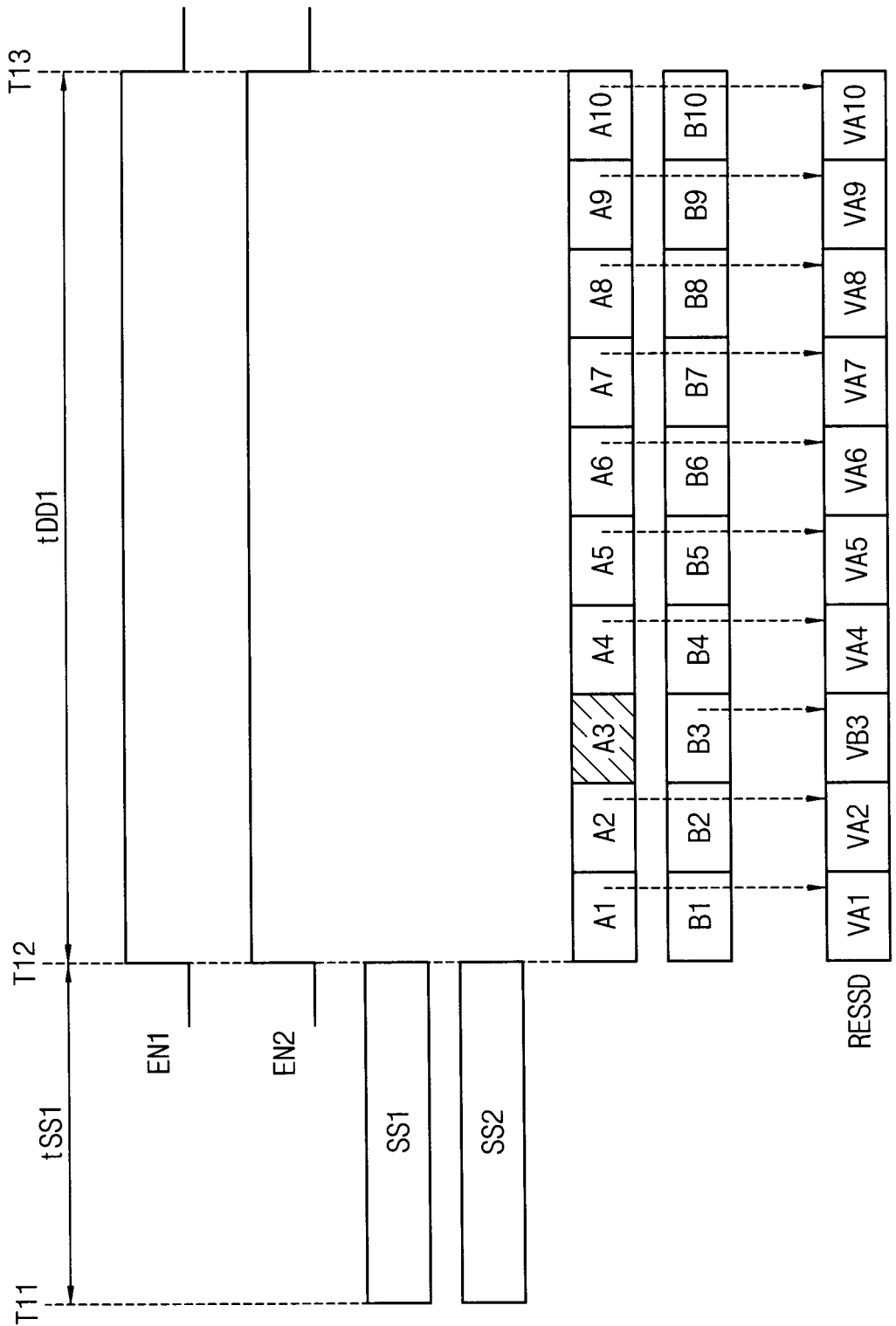
FIGS. 11 through 18 are diagrams illustrating example embodiments of a method of controlling initialization of a nonvolatile memory device corresponding to the read setting data of FIG. 10.

Referring to FIG. 11, the first sensing operation SS1 and the second sensing operation SS2 may be performed simultaneously during a sensing time tSS1 corresponding to a time interval T11~T12. As such, the first sensing operation SS1 and the second sensing operation SS2 may start simultaneously such the first sensing operation SS1 and the second sensing operation SS2 are completed simultaneously.

During a dump-down time tDD1 corresponding to a time interval T12~T13 after the sensing operations SS1 and SS2 are completed, the first enable signal EN1 and the second enable signal EN2 as described with reference to FIG. 6 may be activated simultaneously. Both of the first verification circuit VRFC1 and the second verification circuit VRFC2 may be enabled simultaneously in response to simultaneous activations of the first enable signal EN1 and the second enable signal EN2 to verify validity of the first read setting data RSD1 and second read setting data RSD2, respectively.

The dump-down control logic DDCL may sequentially store first valid data units VA1, VA2 and VA4~VA10 in the buffer 200 based on the first data units A1, A2 and A4~A10 determined as the valid data units. In addition, the dump-down control logic DDCL may sequentially store second valid data units VB3 (in this case, only one second valid data unit) based on the second data unit B3 corresponding to the first data unit A3 determined as the invalid data unit. Note that in the example shown in FIG. 11, there is only one invalid data unit. However, this is merely an example, and in some example embodiments, there may be more than one invalid data unit.

As such, the first verification circuit VRFC1 and the second verification circuit VRFC2 may be enabled simultaneously such that the dump-down operation with respect to the first valid data units VA1, VA2 and VA4~VA10 and the dump-down operation with respect to the second valid data unit VB3 may be performed alternatively.

In case of FIG. 11, the time for the dump-down sequence corresponds to tSS1+tDD1. The related art scheme performs the first sensing operation and the dump-down operation with respect to the first read setting data RSD1. If the result is determined to be failed, the second sensing operation and the dump-down operation with respect to the second read setting data RSD2 are repeated, and the time for the dump-down sequence corresponds to 2*(tSS1+tDD1). As such, the time for the dump-down sequence may be reduced according to example embodiments.

Figure 12:
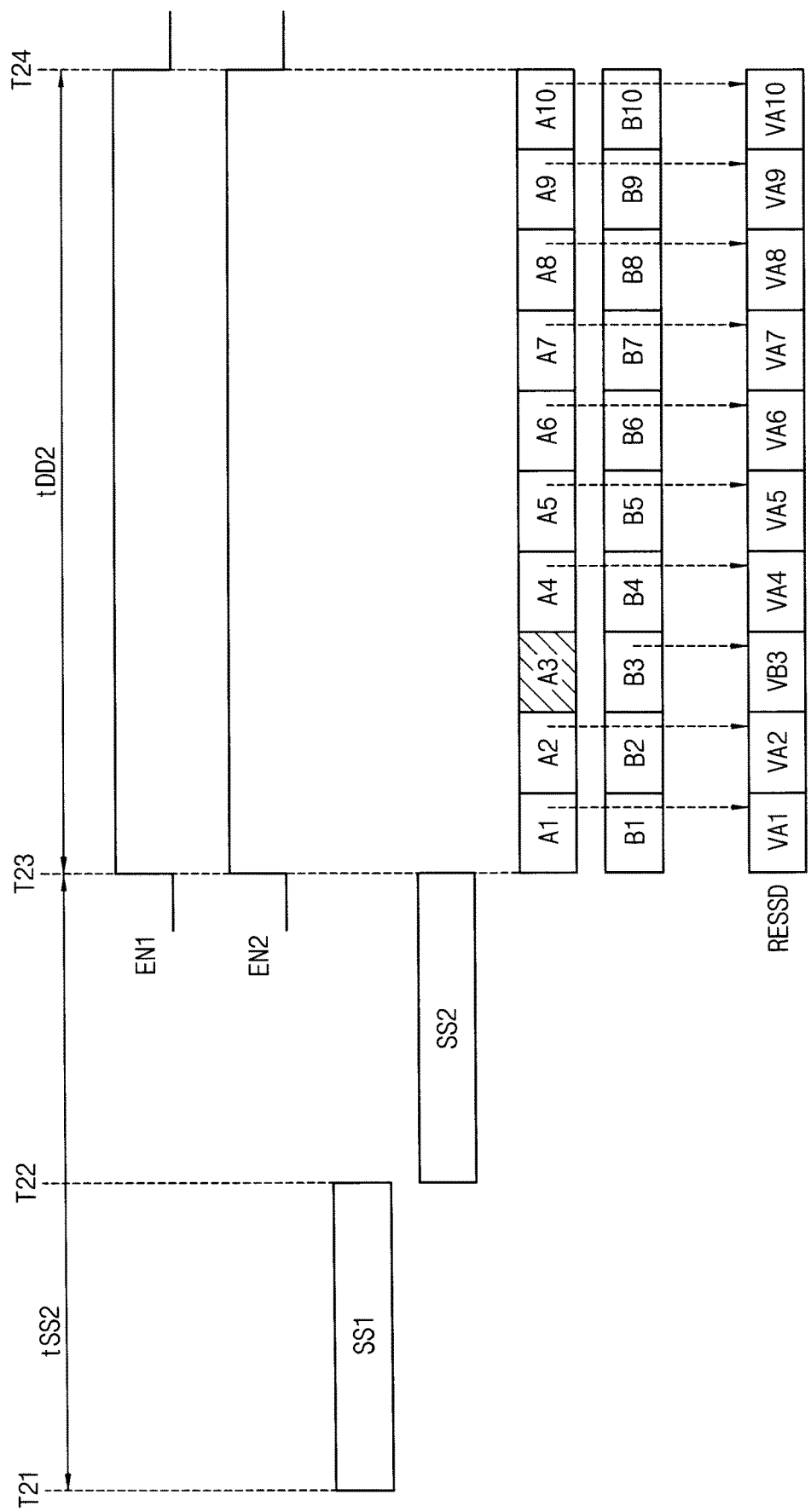
Figure 13:
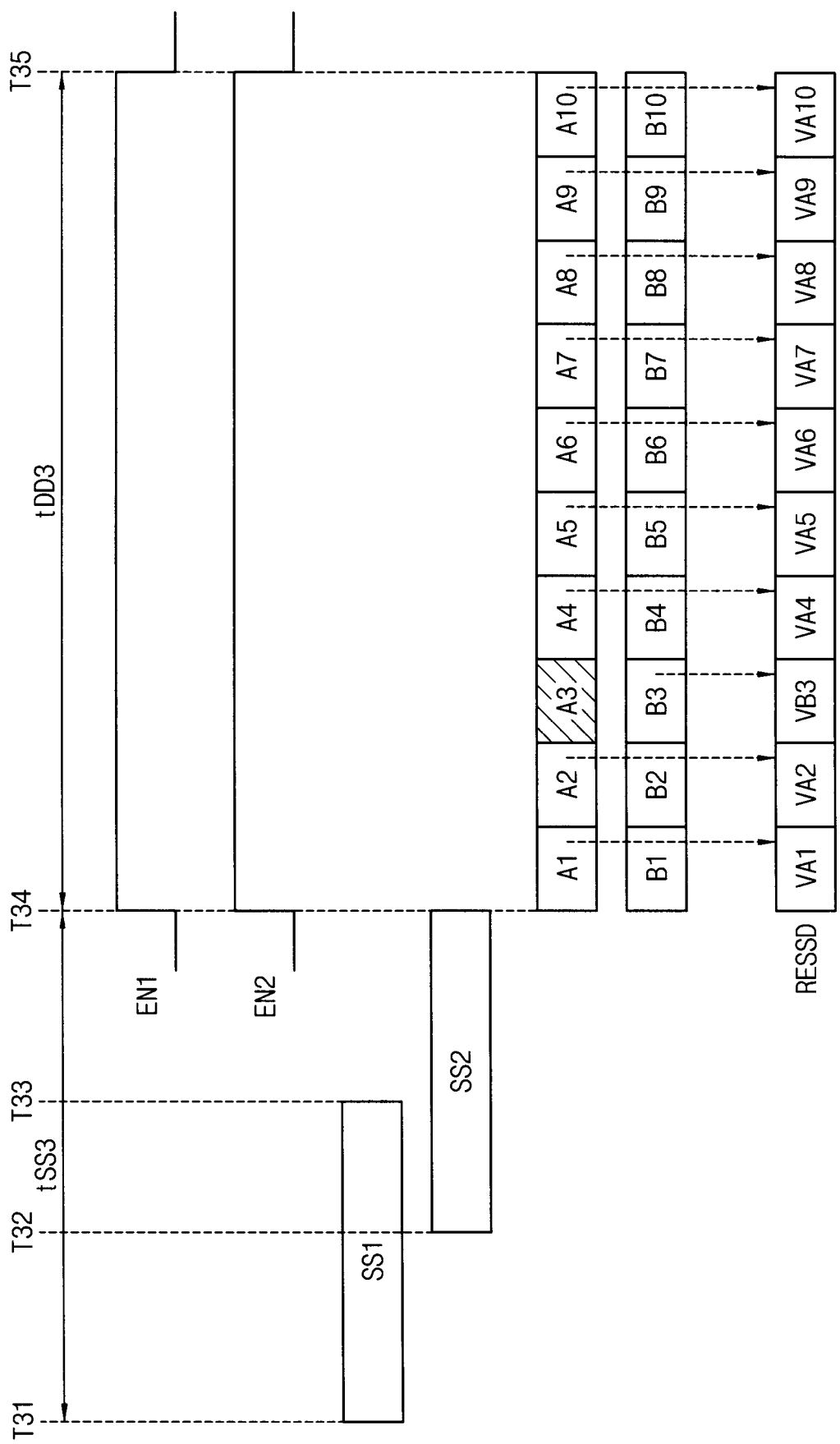

FIGS. 12 and 13 illustrate example embodiments similar to that of FIG. 11 except the timings of the first sensing operation SS1 and the second sensing operation SS2, and the repeated descriptions are omitted for conciseness.

Referring to FIG. 12, the first sensing operation SS1 and the second sensing operation SS2 may be performed sequentially during a sensing time tSS2 corresponding to time intervals T21~T22 and T22~T23. During a dump-down time tDD2 corresponding to a time interval T23~T24, the first enable signal EN1 and the second enable signal EN2 are activated simultaneously so that both of the first verification circuit VRFC1 and the second verification circuit VRFC2 may verify validity of the first read setting data RSD1 and the second read setting data RSD2 simultaneously.

Referring to FIG. 13, the first sensing operation SS1 and the second sensing operation SS2 may be performed sequentially during a sensing time tSS3 corresponding to time interval T31~T34. That is, the first sensing operation SS1 may performed during time interval T31~T33, and the second sensing operation SS2 may be performed during the time interval T32~T34 wherein T31~T33 partially overlaps with T32~T34 and T31~T33 corresponds to the sensing time tSS3. During a dump-down time tDD3 corresponding to a time interval T34~T35, the first enable signal EN1 and the second enable signal EN2 are activated simultaneously so that both of the first verification circuit VRFC1 and the second verification circuit VRFC2 may verify validity of the first read setting data RSD1 and the second read setting data RSD2 simultaneously.

As illustrated in FIGS. 12 and 13, the first sensing operation SS1 may start in advance before the second sensing operation SS2 starts such that a completion time point of the first sensing operation precedes a completion time point of the second sensing operation. In both cases of FIGS. 12 and 13, the dump-down operation may start at the completion time point of the second sensing operation SS2.

As such, the overlapping time interval T32~T33 while the first sensing operation SS1 and the second sensing operation SS2 are performed in parallel may be adjusted by controlling the start time point T32 of the second sensing operation SS2. The time for the dump-down sequence (i.e., tSSx+tDDx) is increased as the overlapping time interval T32~T33 is decreased. However, power consumption may be reduced as the overlapping time interval T32~T33 is decreased because a peak current in the nonvolatile memory device is increased during the overlapping time interval T32~T33.

Figure 14:
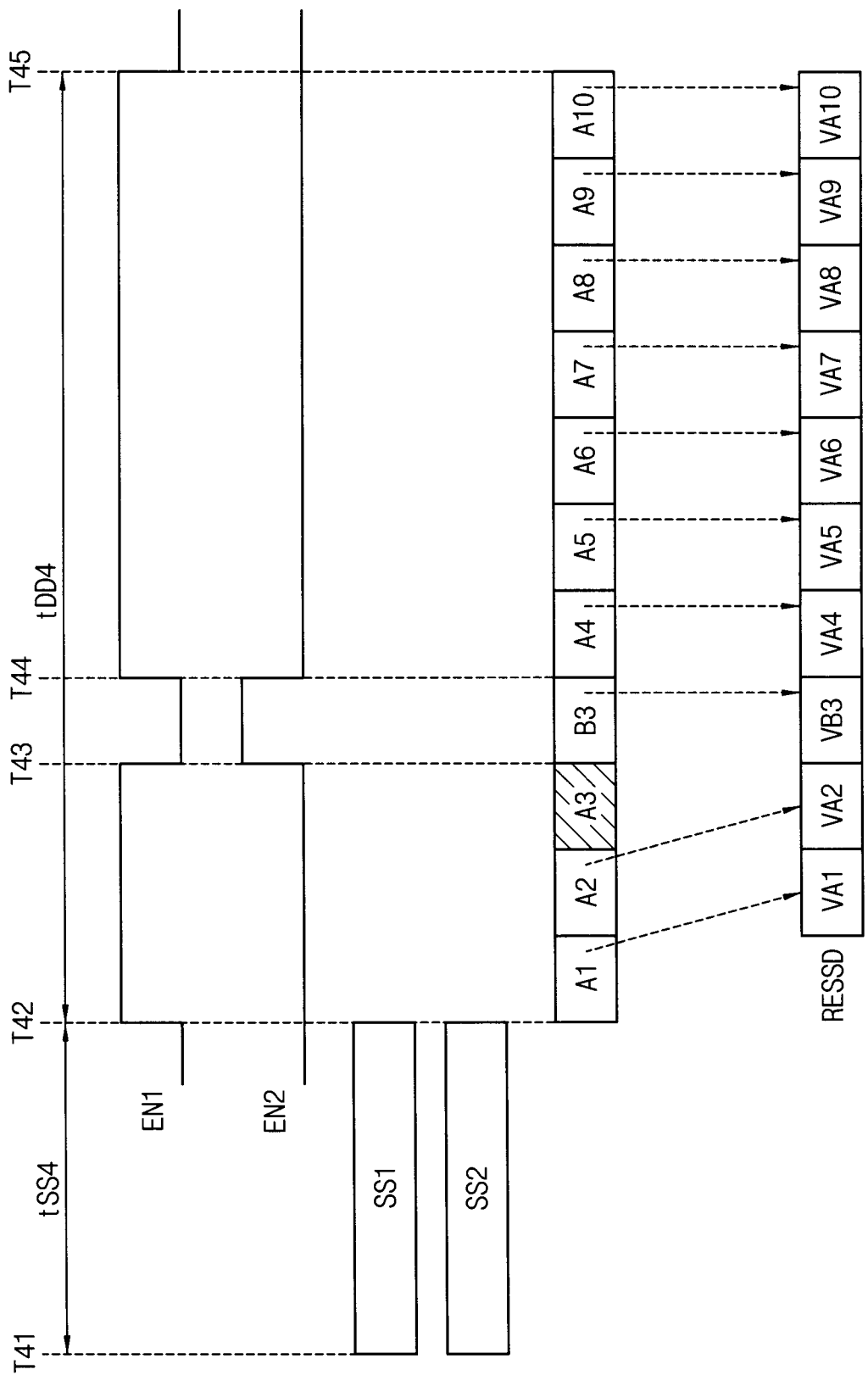

Referring to FIG. 14, the first sensing operation SS1 and the second sensing operation SS2 may be performed simultaneously during a sensing time tSS4 corresponding to a time interval T41~T42. As such, the first sensing operation SS1 and the second sensing operation SS2 may start simultaneously such that the first sensing operation SS1 and the second sensing operation SS2 are completed simultaneously.

During a dump-down time tDD4 corresponding to a time interval T42~T45 after the sensing operations SS1 and SS2 are completed, the first enable signal EN1 and the second enable signal EN2 as described with reference to FIG. 6 may be activated selectively or alternatively. In other words, only the first enable signal EN1 may be activated during the time intervals T42~T43 and T44~T45, and only the second enable signal EN2 may be activated during the time interval T43~T44.

The first verification circuit VRFC1 and the second verification circuit VRFC2 may be enabled alternatively in response to selective activations of the first enable signal EN1 and the second enable signal EN2 to verify validity of the first read setting data RSD1 and second read setting data RSD2, respectively.

As a result, as illustrated in FIG. 14, the dump-down operation based on the first read setting data RSD1 may be performed as a main operation and the dump-down operation based on the second read setting data RSD2 may be performed as a supplementary operation while the first data unit A3 of the first read setting data RSD1 is determined as the invalid data unit.

Figure 15:
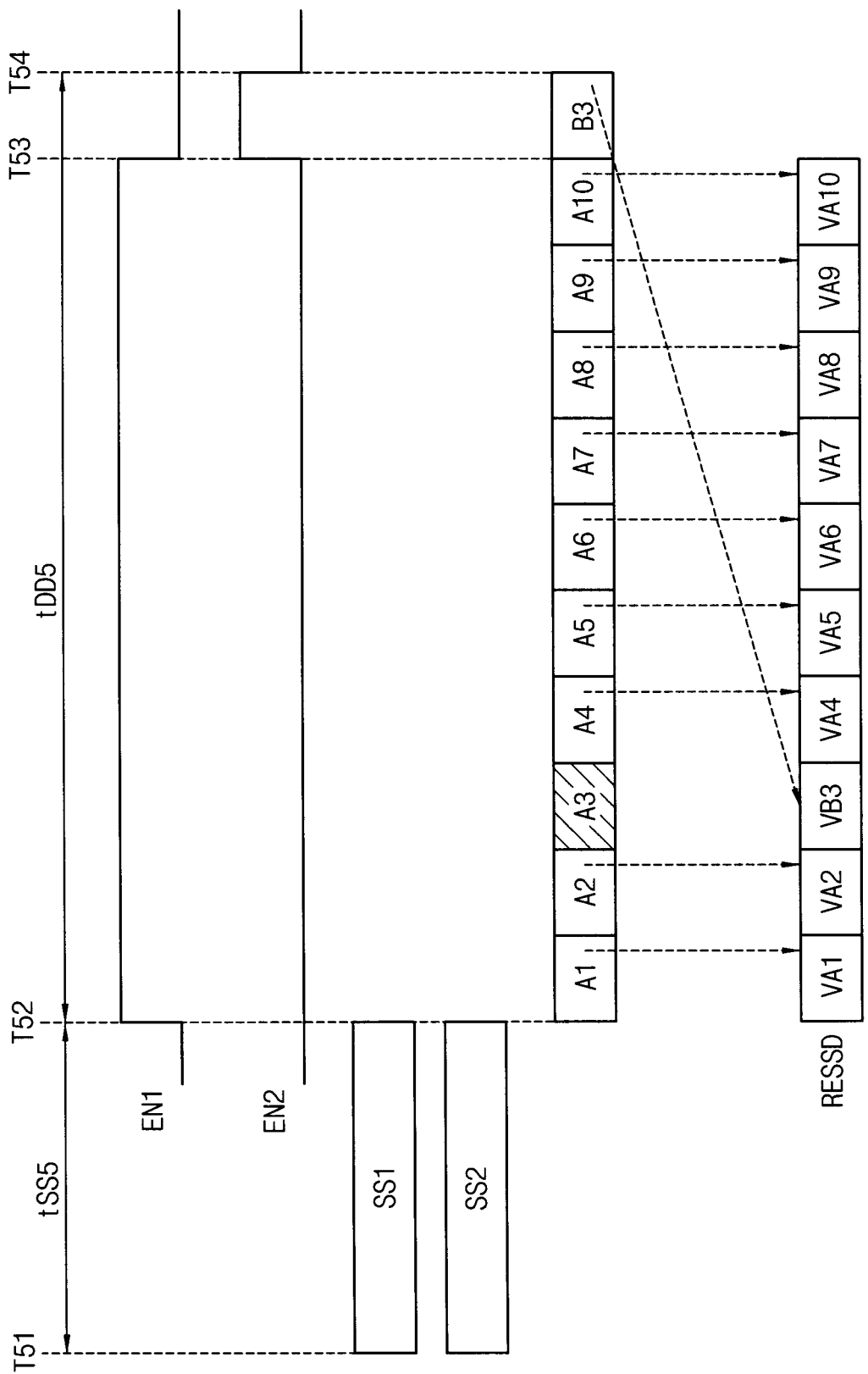

Referring to FIG. 15, the first sensing operation SS1 and the second sensing operation SS2 may be performed simultaneously during a sensing time tSS5 corresponding to a time interval T51~T52. As such, the first sensing operation SS1 and the second sensing operation SS2 may start simultaneously such the first sensing operation SS1 and the second sensing operation SS2 are completed simultaneously.

During a dump-down time tDD5 corresponding to a time interval T52~T54 after the sensing operations SS1 and SS2 are completed, the first enable signal EN1 and the second enable signal EN2 as described with reference to FIG. 6 may be activated selectively or alternatively. In other words, only the first enable signal EN1 may be activated during the time interval T52~T53, and only the second enable signal EN2 may be activated during the time interval T53~T54.

The first verification circuit VRFC1 and the second verification circuit VRFC2 may be enabled alternatively in response to selective activations of the first enable signal EN1 and the second enable signal EN2 to verify validity of the first read setting data RSD1 and second read setting data RSD2, respectively.

As a result, as illustrated in FIG. 15, the dump-down operation based on the first read setting data RSD1 may be performed as a main operation and the dump-down operation based on the second read setting data RSD2 may be performed as a supplementary operation while the first data unit A3 of the first read setting data RSD1 is determined as the invalid data unit.

Figure 16:
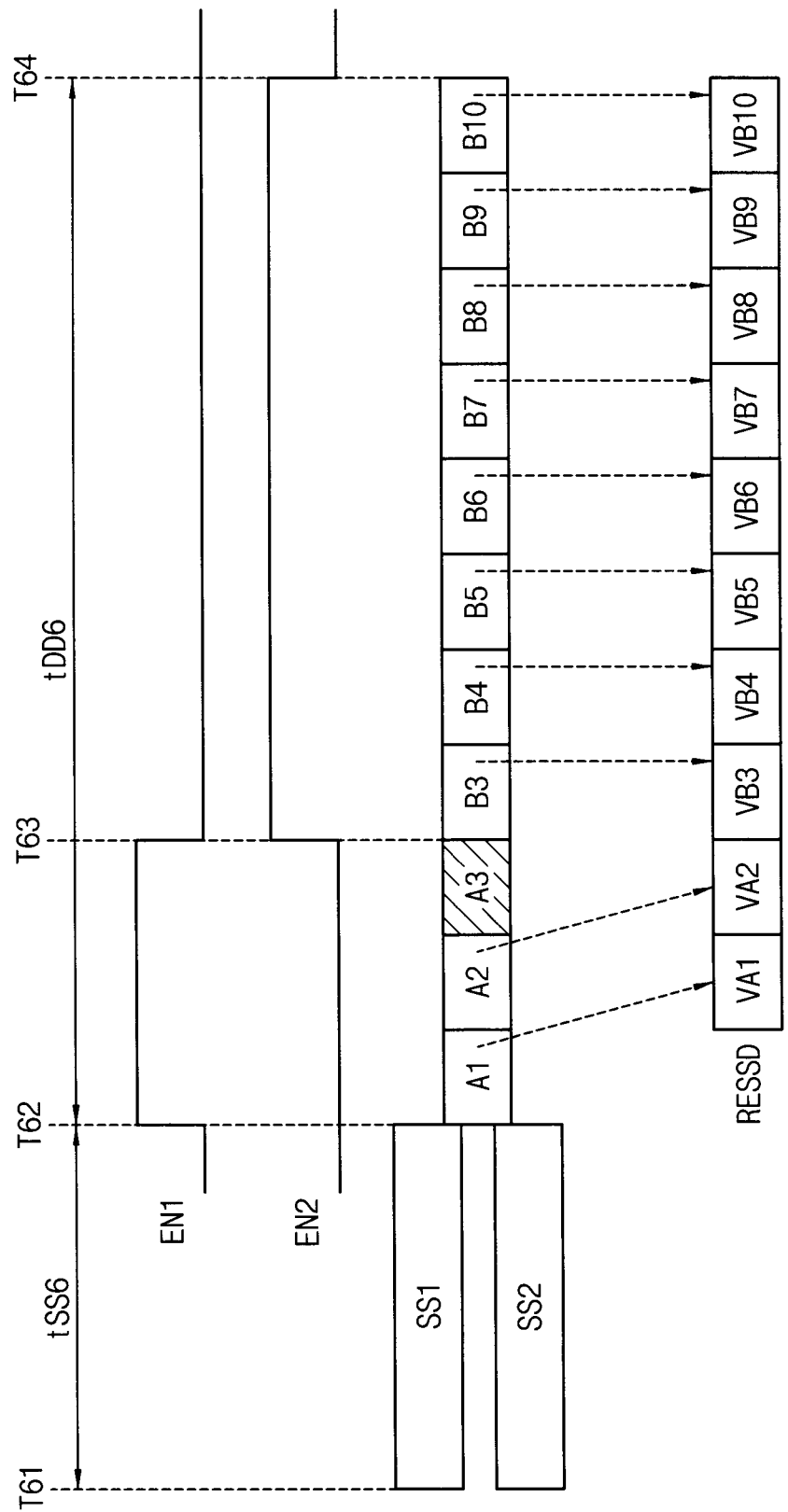

Referring to FIG. 16, the first sensing operation SS1 and the second sensing operation SS2 may be performed simultaneously during a sensing time tSS6 corresponding to a time interval T61~T62. As such, the first sensing operation SS1 and the second sensing operation SS2 may start simultaneously such the first sensing operation SS1 and the second sensing operation SS2 are completed simultaneously.

During a dump-down time tDD6 corresponding to a time interval T62~T64 after the sensing operations SS1 and SS2 are completed, the first enable signal EN1 and the second enable signal EN2 as described with reference to FIG. 6 may be activated selectively or alternatively. In other words, only the first enable signal EN1 may be activated during the time interval T62~T63, and only the second enable signal EN2 may be activated during the time interval T63~T64.

The first verification circuit VRFC1 and the second verification circuit VRFC2 may be enabled alternatively in response to selective activations of the first enable signal EN1 and the second enable signal EN2 to verify validity of the first read setting data RSD1 and second read setting data RSD2, respectively.

The dump-down control logic DDCL may sequentially store the first valid data units VA1 and VA2 in the buffer 200 based on the first data units A1 and A2 before the first data unit A3 of the plurality of first data units A1~A10 is determined as the invalid data unit. In addition, the dump-down control logic DDCL may sequentially store the second valid data units VB3~VB10 in the buffer 200 based on the second data units B3~B10 starting from the second data unit B3 corresponding to the first data unit A3 determined as the invalid data unit.

As such, the first verification circuit VRFC1 may be enabled to perform the dump-down operation for the first valid data units VA1~VA2 and the second verification circuit VRFC2 may be disabled before the first data unit A3 of the plurality of first data units A1~A10 is determined as the invalid data unit. In addition, the first verification circuit VRFC1 may be disabled and the second verification circuit VRFC2 may be enabled to perform the dump-down operation for the second valid data units VB3~VB10 after the first data unit A3 is determined as the invalid data unit.

Figure 17:
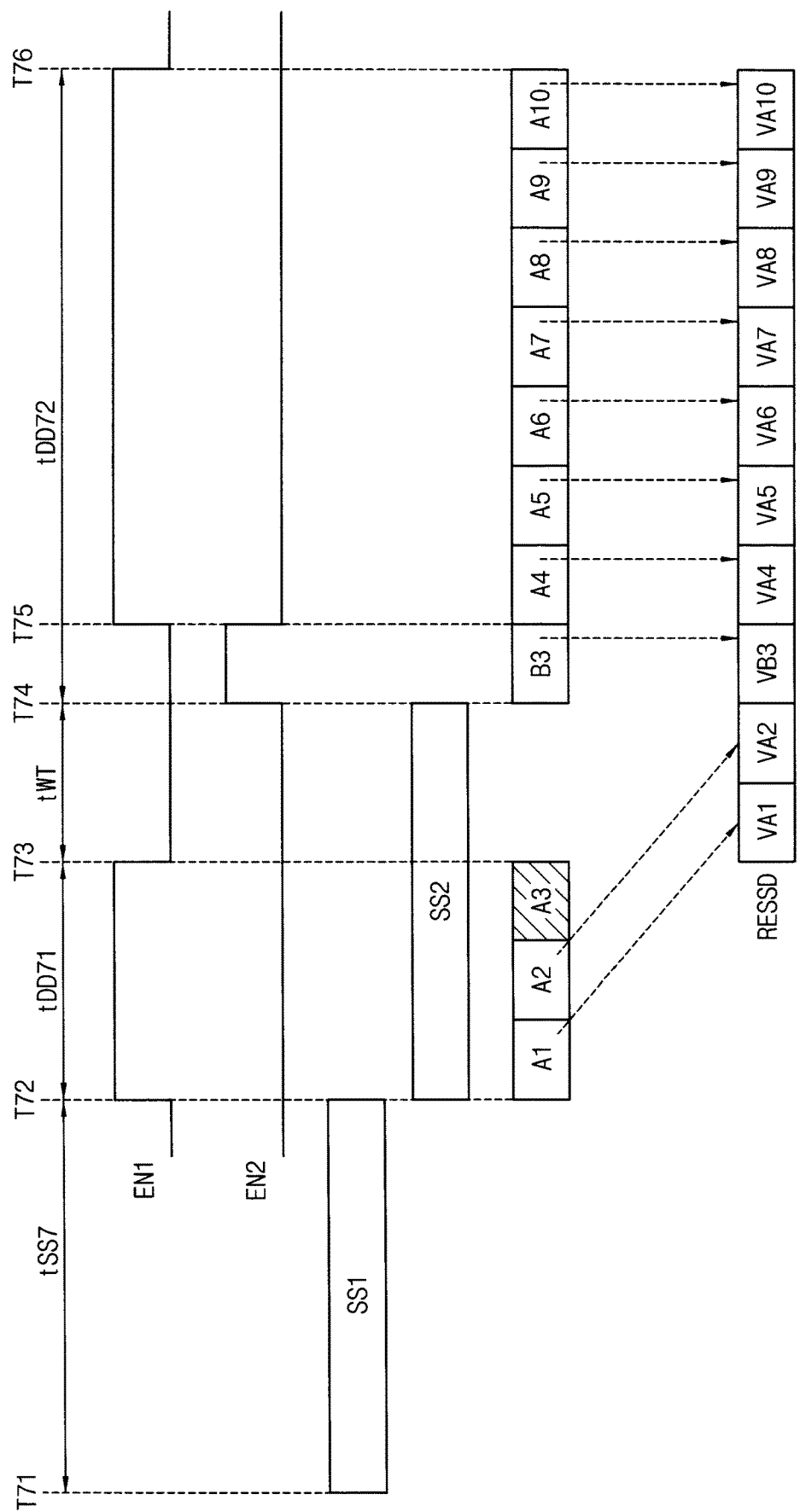

Referring to FIG. 17, the first sensing operation SS1 may be performed during a sensing time tSS7 corresponding to a time interval T71~T72 and the dump-down operation based on the first read setting data RSD1 may start at the completion time point T72 of the first sensing operation SS1. In addition, the second sensing operation SS2 may start at the completion time point T72 of the first sensing operation SS1.

When the second sensing operation SS2 is not completed at a time point T73 when the first data unit A3 of the plurality of first data units A1~A10 is determined as the invalid data unit, both of the first enable signal EN1 and the second enable signal EN2 may be disabled until the completion time point T74 of the second sensing operation SS2. In other words, both of the first verification circuit VRFC1 and the second verification circuit VRFC2 may be disabled during a standby time tWT corresponding to a time interval T73~T74 until the second sensing operation SS2 is completed.

During a first dump-down time tDD71 corresponding to a time interval T72~T73 and a second dump-down time tDD72 corresponding to a time interval T74~T76, the first enable signal EN1 and the second enable signal EN2 as described with reference to FIG. 6 may be activated selectively. In other words, only the first enable signal EN1 may be activated during the time intervals T72~T73 and T75, and only the second enable signal EN2 may be activated during the time interval T74~T75.

The first verification circuit VRFC1 and the second verification circuit VRFC2 may be enabled alternatively in response to selective activations of the first enable signal EN1 and the second enable signal EN2 to verify validity of the first read setting data RSD1 and second read setting data RSD2, respectively.

As a result, as illustrated in FIG. 17, the dump-down operation based on the first read setting data RSD1 may be performed as a main operation and the dump-down operation based on the second read setting data RSD2 may be performed as a supplementary operation after the second sensing operation SS2 is completed.

Figure 18:
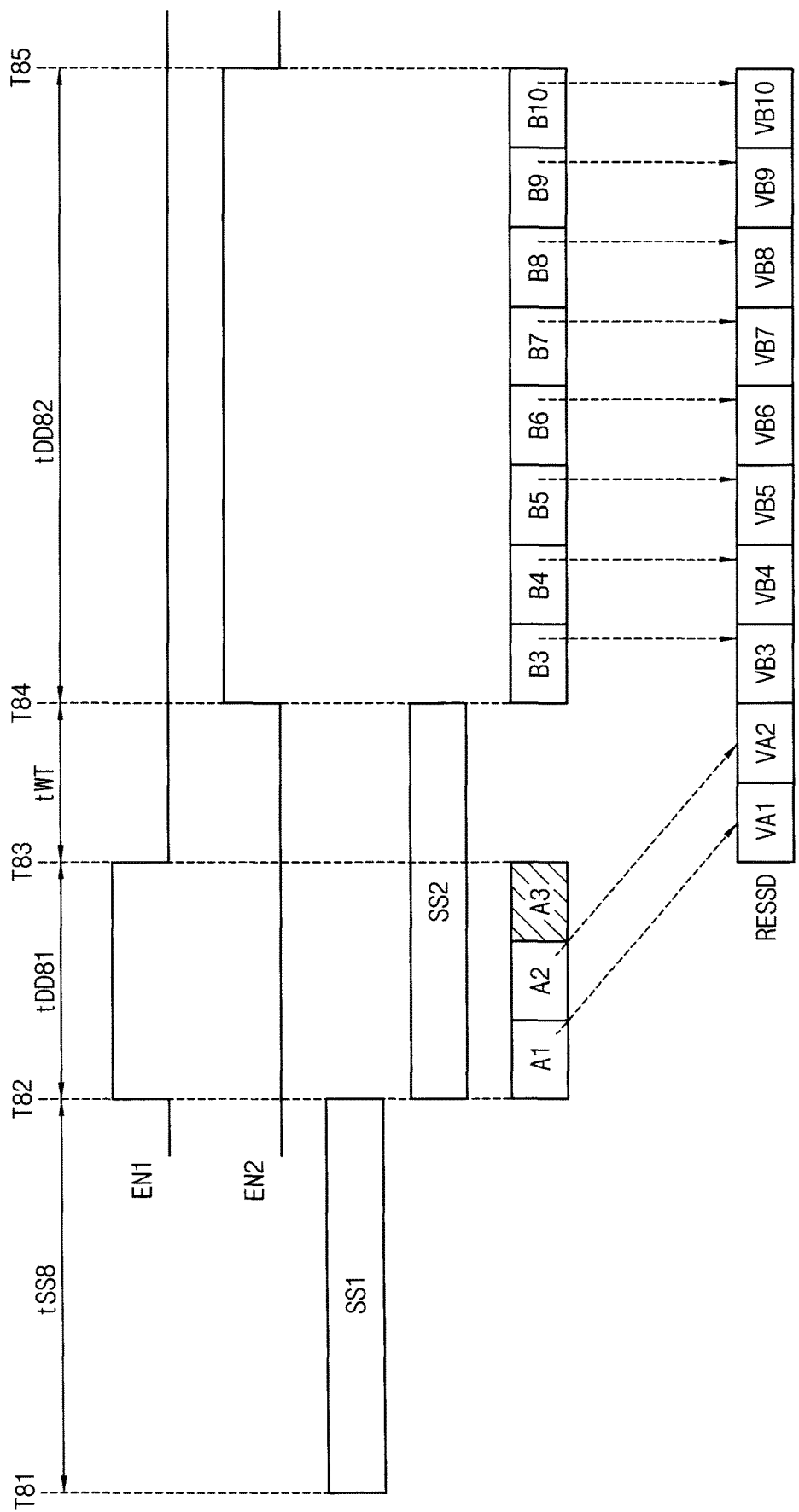

Referring to FIG. 18, the first sensing operation SS1 may be performed during a sensing time tSS8 corresponding to a time interval T81~T82 and the dump-down operation based on the first read setting data RSD1 may start at the completion time point T82 of the first sensing operation SS1. In addition, the second sensing operation SS2 may start at the completion time point T82 of the first sensing operation SS1.

When the second sensing operation SS2 is not completed at a time point T83 when the first data unit A3 of the plurality of first data units A1~A10 is determined as the invalid data unit, both of the first enable signal EN1 and the second enable signal EN2 may be disabled until the completion time point T84 of the second sensing operation SS2. In other words, both of the first verification circuit VRFC1 and the second verification circuit VRFC2 may be disabled during a standby time tWT corresponding to a time interval T83~T84 until the second sensing operation SS2 is completed.

During a first dump-down time tDD81 corresponding to a time interval T82~T83 and a second dump-down time tDD82 corresponding to a time interval T84~T85, the first enable signal EN1 and the second enable signal EN2 as described with reference to FIG. 6 may be activated selectively. In other words, only the first enable signal EN1 may be activated during the time interval T82~T83, and only the second enable signal EN2 may be activated during the time interval T84~T85.

The first verification circuit VRFC1 and the second verification circuit VRFC2 may be enabled alternatively in response to selective activations of the first enable signal EN1 and the second enable signal EN2 to verify validity of the first read setting data RSD1 and second read setting data RSD2, respectively.

The dump-down control logic DDCL may sequentially store the first valid data units VA1 and VA2 in the buffer 200 based on the first data units A1 and A2 before the first data unit A3 is determined as the invalid data unit. In addition, the dump-down control logic DDCL may sequentially store the second valid data units VB3~VB10 in the buffer 200 based on the second data units B3~B10 starting from the second data unit B3 corresponding to the first data unit A3 determined as the invalid data unit.

FIG. 19 is a diagram illustrating an example of a read setting data sensed from a nonvolatile memory device according to example embodiments. The descriptions repeated with FIG. 10 are omitted for conciseness.

In FIG. 19, an invalid data unit having uncorrectable errors may be represented to be hatched. FIG. 19 illustrates an example that two first data units A3 and A4 of the first read setting data RSD1 are the invalid data units and the one second data unit B6 of the second read setting data RSD2 is an invalid data unit.

FIGS. 20 through 23 are diagrams illustrating example embodiments of a method of controlling initialization of a nonvolatile memory device corresponding to the read setting data of FIG. 19.

Figure 20:
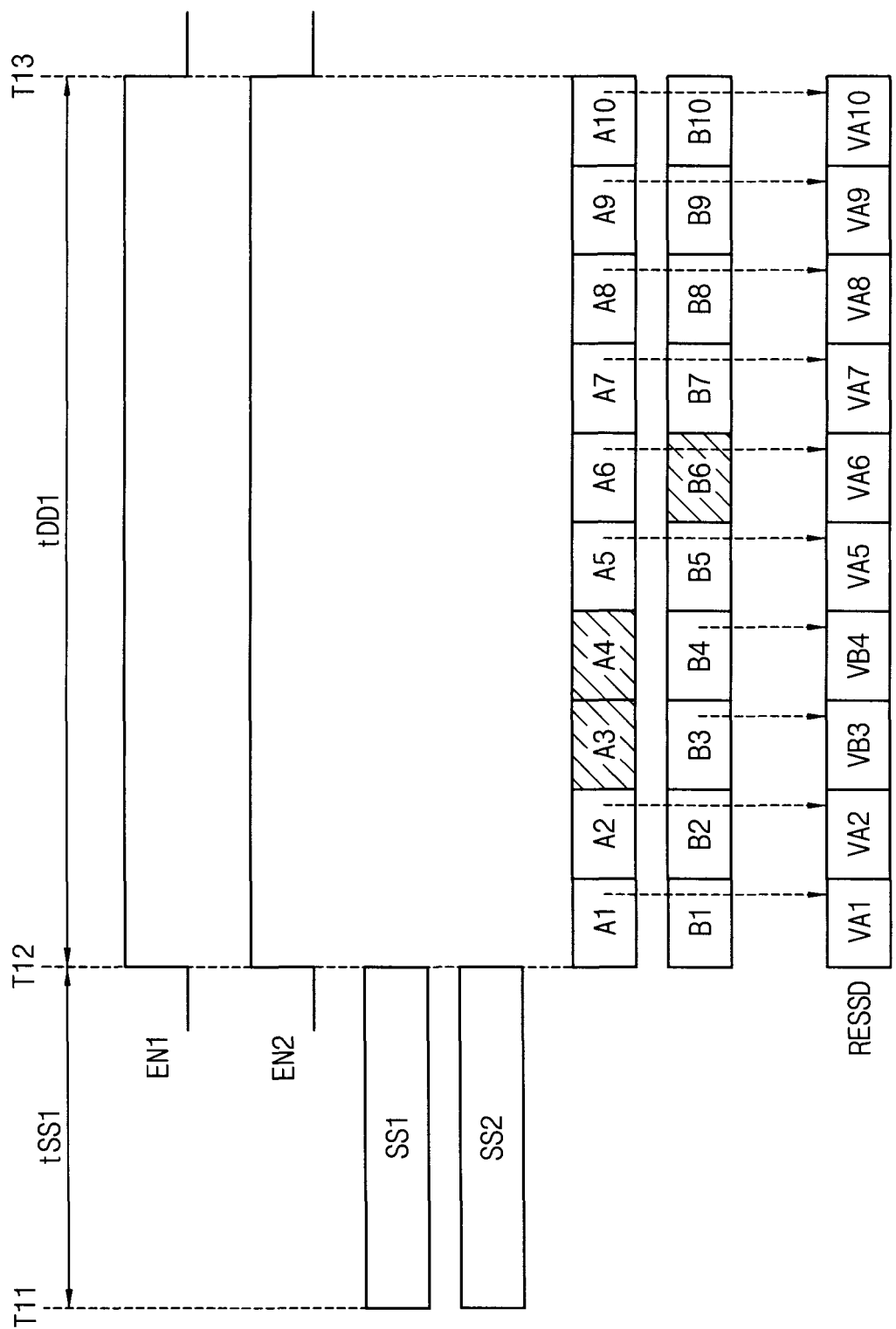
FIGS. 20 through 23 are diagrams illustrating example embodiments of a method of controlling initialization of a nonvolatile memory device corresponding to the read setting data of FIG. 19.
Figure 21:
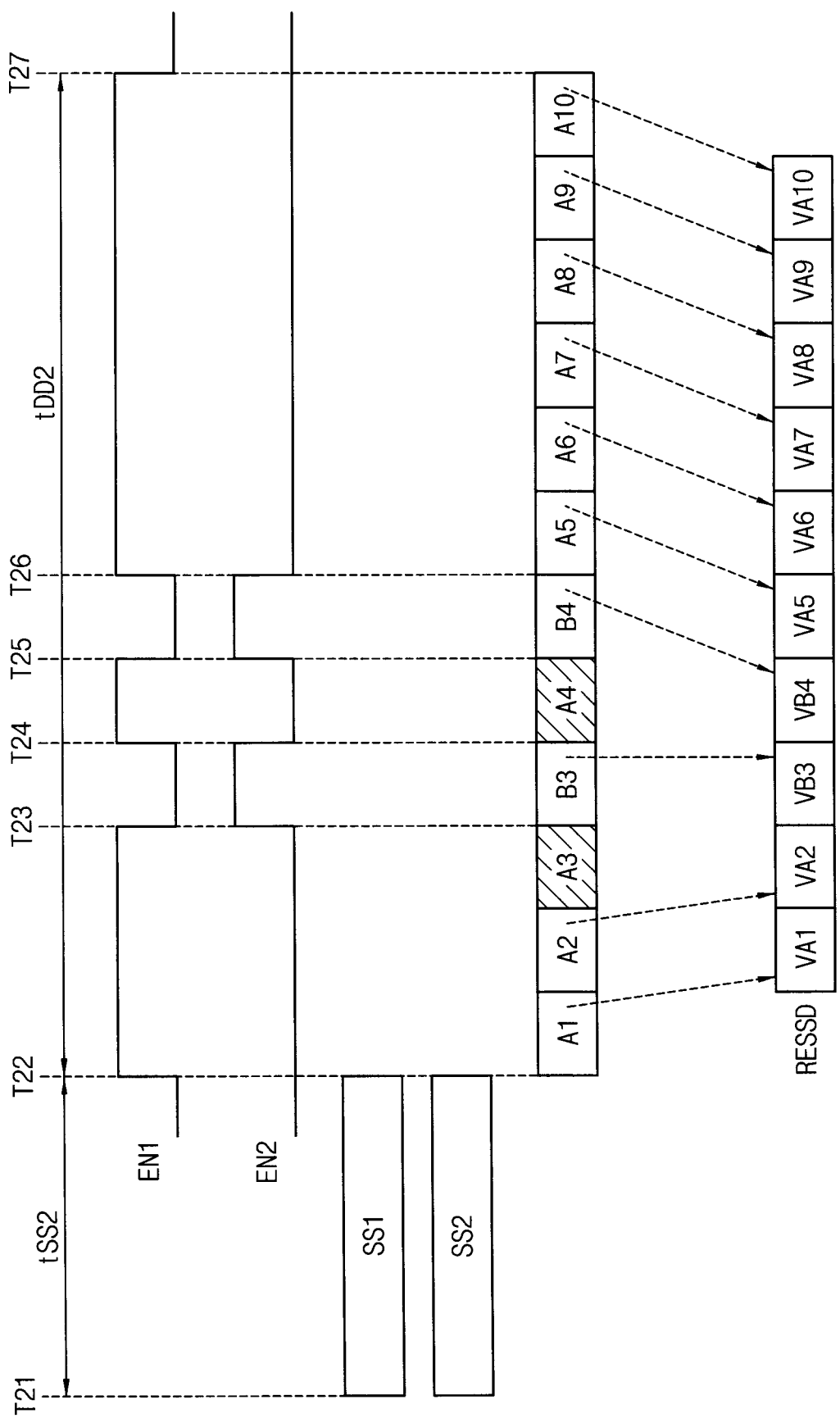
Figure 22:
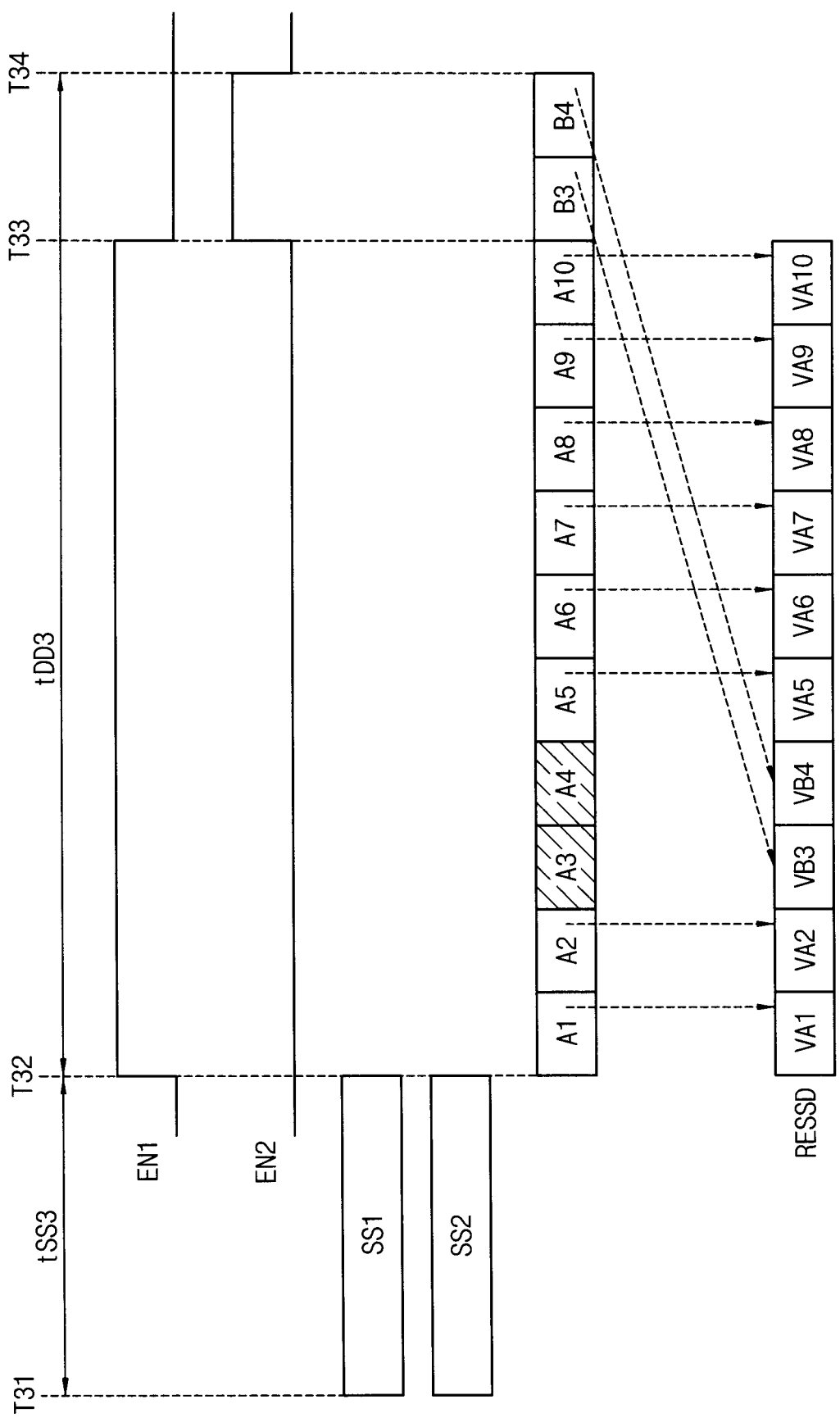

The methods of FIGS. 20, 21 and 22 are substantially the same as the methods of FIGS. 11, 14 and 15, respectively except the invalid data units, and thus the repeated descriptions are omitted for conciseness. As a result, as illustrated in FIGS. 20, 21 and 22, the first valid data units VA1, VA2 and VA5~VA10 and the second valid data units VB3 and VB4 may be stored in the buffer 200 as the restored setting data RESSD.

Figure 23:
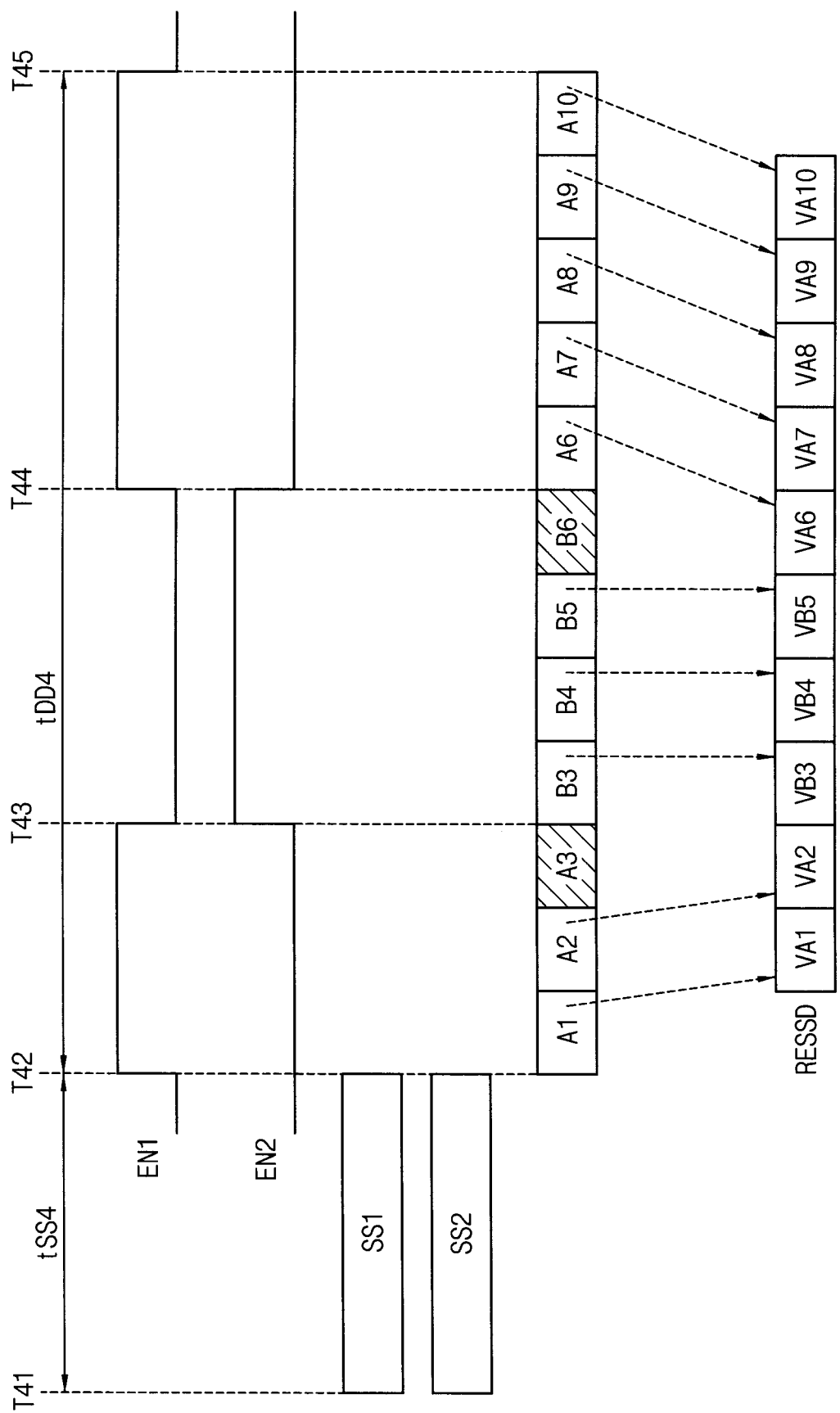

Referring to FIG. 23, the first sensing operation SS1 and the second sensing operation SS2 may be performed simultaneously during a sensing time tSS4 corresponding to a time interval T41~T42. During a dump-down time tDD4 corresponding to a time interval T42~T45 after the sensing operations SS1 and SS2 are completed, the first enable signal EN1 and the second enable signal EN2 as described with reference to FIG. 6 may be activated selectively or alternatively. The first verification circuit VRFC1 and the second verification circuit VRFC2 may be enabled alternatively in response to selective activations of the first enable signal EN1 and the second enable signal EN2 to verify validity of the first read setting data RSD1 and second read setting data RSD2, respectively.

The dump-down control logic DDCL may sequentially store the first valid data units VA1 and VA2 in the buffer 200 based on the first data units A1 and A2 before the first data unit A3 of the plurality of first data units A1~A10 is determined as the invalid data unit. After that, the dump-down control logic DDCL may sequentially store the second valid data units VB3~VB5 in the buffer 200 based on the second data units B3~B4 before the second data unit B6 of the plurality of second data units B1~B10 is determined as the invalid data unit. In addition, the dump-down control logic DDCL may sequentially store the first valid data units VA6~VA10 in the buffer 200 based on the first data units A6~A10 starting from the first data unit A6 corresponding to the second data unit B6 determined as the invalid data unit.

As a result, as illustrated in FIG. 23, the first valid data units VA1, VA2 and VA6~VA10 and the second valid data units VB3~VB5 may be stored in the buffer 200 as the restored setting data RESSD.

Figure 24:
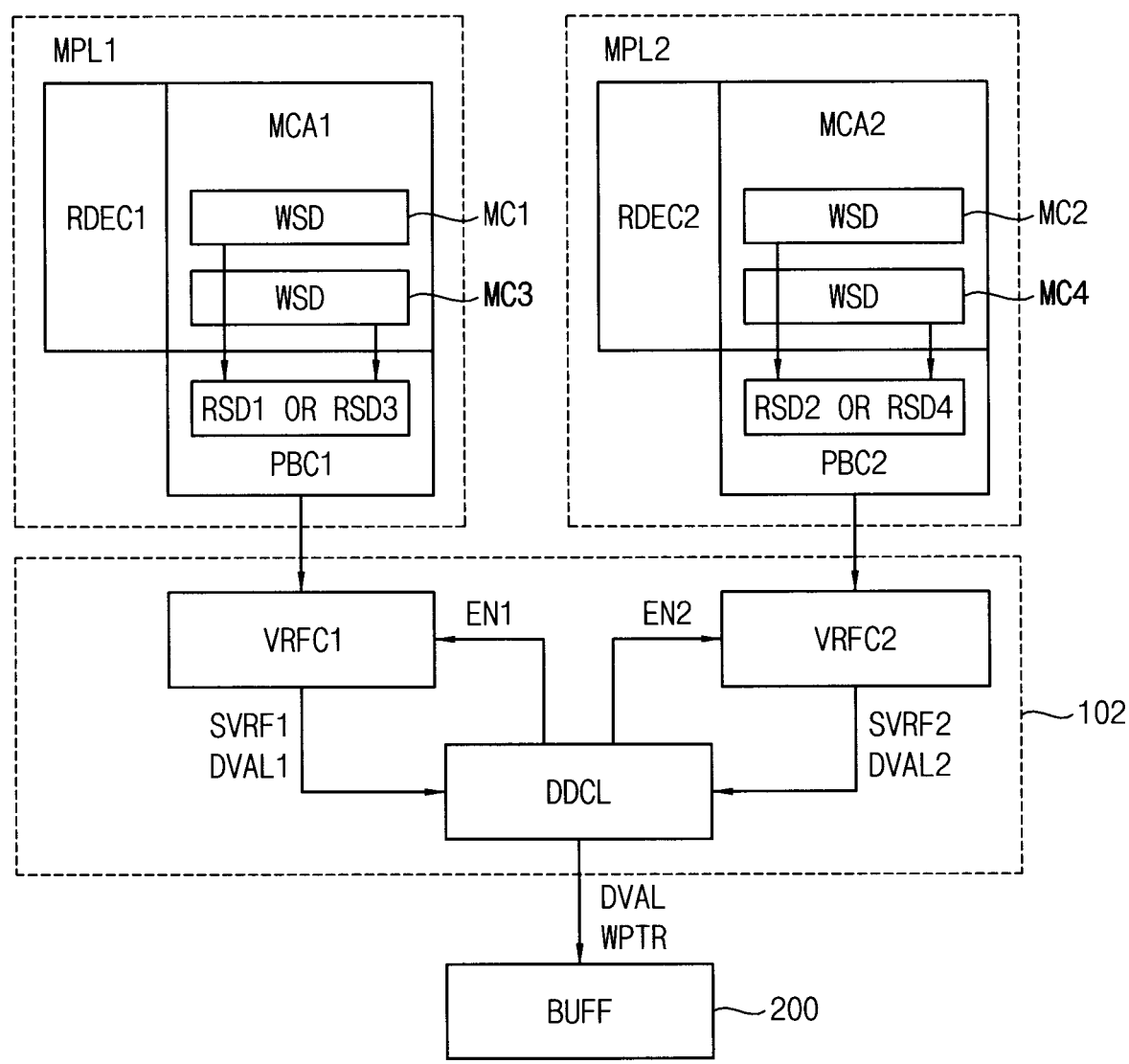
FIG. 24 is a diagram illustrating a nonvolatile memory device according to example embodiments.

FIG. 24 is a diagram illustrating a nonvolatile memory device according to example embodiments.

Referring to FIG. 24, a nonvolatile memory device 12 may include a first memory plane MPL1, a second memory plane MPL2, a dump-down circuit 102 and a buffer 200. The nonvolatile memory device 12 of FIG. 24 is similar to the nonvolatile memory device 11 of FIG. 6, and the repeated descriptions are omitted for conciseness. The description that follows focuses mainly on the differences with the embodiment shown in FIG. 6.

The write setting data WSD may be stored in first memory cells MC1 of the first memory plane MPL1 and second memory cells MC2 of the second memory plane MPL2. In addition, the write setting data WSD may be stored in third memory cells MC3 of the first memory plane MPL1 and fourth memory cells MC4 of the second memory plane MPL2.

A first sensing operation may be performed to sense the write setting data WSD stored in the first memory cells MC1 and store a first read setting data RSD1 in the first page buffer circuit PBC1, and a second sensing operation may be performed to sense the write setting data WSD stored in the second memory cells MC2 and store a second read setting data RSD2 in the second page buffer circuit PBC2. The above-described dump-down operation may be performed based on the first read setting data RSD1 and the second read setting data RSD2. If the dump-down operation based on the first read setting data RSD1 and the second read setting data RSD2 is determined as a failure, a third sensing operation may be performed to sense the write setting data WSD stored in the third memory cells MC3 and store a third read setting data RSD3 in the first page buffer circuit PBC1, and a fourth sensing operation may be performed to sense the write setting data WSD stored in the fourth memory cells MC4 and store a fourth read setting data RSD4 in the second page buffer circuit PBC2.

As such, the first and second read setting data RSD1 and RSD2 in the first and second page buffer circuits PBC1 and PBC2 may be replaced with the third and fourth read setting data RSD3 and RSD4, and the above-described dump-down operation may be performed based on the third and fourth read setting data RSD3 and RSD4.

FIG. 25 is a diagram illustrating an example of a read setting data sensed from a nonvolatile memory device according to example embodiments. The descriptions repeated with FIG. 10 are omitted for conciseness.

In FIG. 25, an invalid data unit having uncorrectable errors may be represented to be hatched. FIG. 25 illustrates an example in which two first data units A3 and A5 of the first read setting data RSD1 are the invalid data units, one second data unit B5 of the second read setting data RSD2 is the invalid data unit, two third data units C2 and C10 of the third read setting data RSD3 are the invalid data units, and one fourth data unit D6 of the fourth read setting data RSD4 is the invalid data unit.

Figure 26:
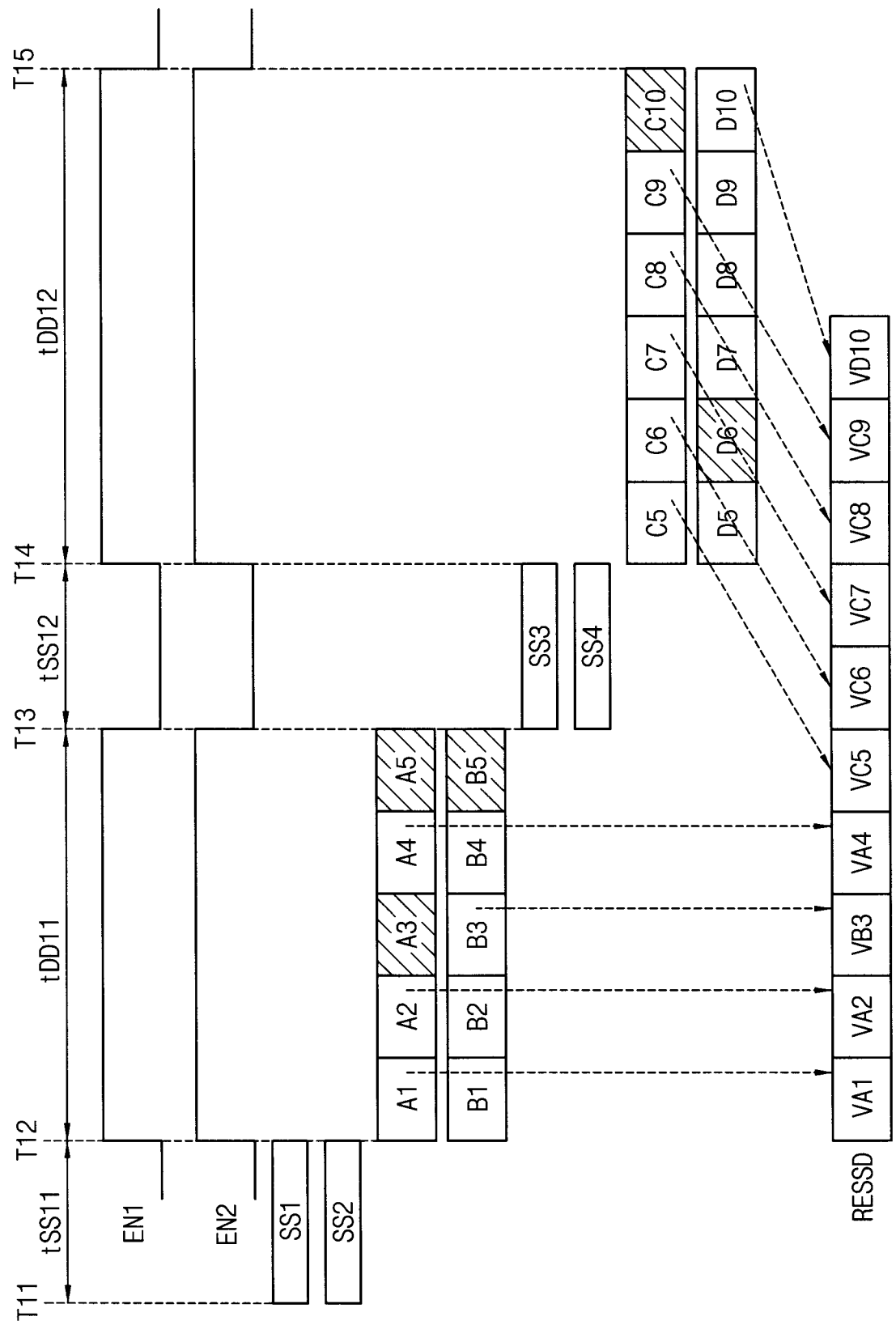
FIGS. 26 and 27 are diagrams illustrating example embodiments of a method of controlling initialization of a nonvolatile memory device corresponding to the read setting data of FIG. 25.
Figure 27:
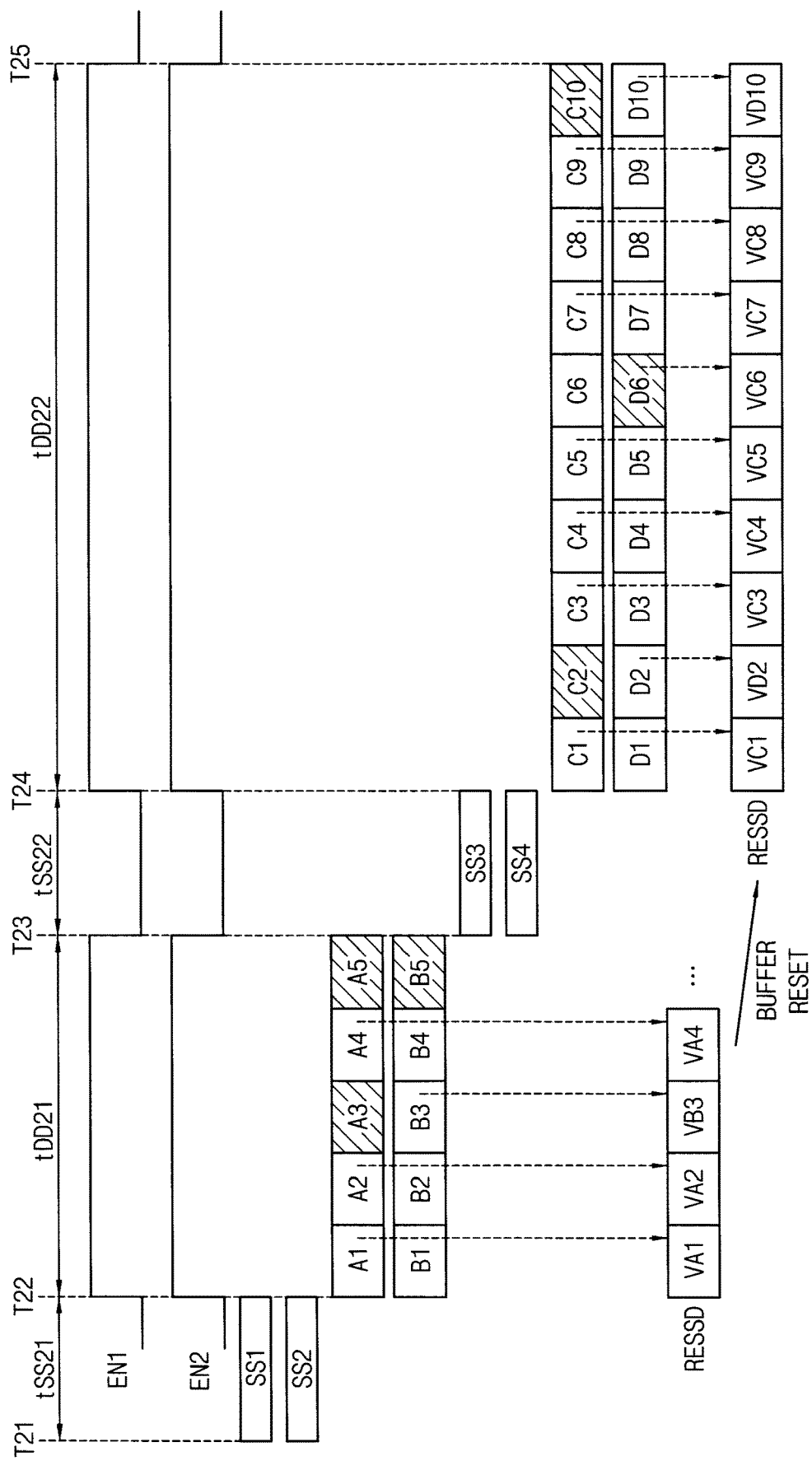

FIGS. 26 and 27 are diagrams illustrating example embodiments of a method of controlling initialization of a nonvolatile memory device corresponding to the read setting data of FIG. 25.

Referring to FIG. 26, the first sensing operation SS1 and the second sensing operation SS2 may be performed simultaneously during a first sensing time tSS11 corresponding to a time interval T11~T12. During a first dump-down time tDD11 corresponding to a time interval T12~T13, the first enable signal EN1 and the second enable signal EN2 may be activated simultaneously, and the dump-down operation based on the first read setting data RSD1 and the second read setting data RSD2 may be performed as described with reference to FIG. 11. At the time point T13, it is determined that both of the first data unit A5 of the first read setting data RSD1 and the corresponding second data unit B5 are determined as invalid data units, and the dump-down operation based on the first read setting data RSD1 and the second read setting data RSD2 is determined as a failure.

The third sensing operation SS3 and the fourth sensing operation SS4 may be performed simultaneously during a second sensing time tSS12 corresponding to a time interval T13~T14. During a second dump-down time tDD12 corresponding to a time interval T14~T15, the first enable signal EN1 and the second enable signal EN2 may be activated simultaneously, and the dump-down operation based on the third read setting data RSD3 and the fourth read setting data RSD4 may be performed as described with reference to FIG. 11.

In this case, the first valid data units VA1, VA2 and VA4 and the second valid data units VB3 are stored already in the buffer 200, the dump-down operation based on the third read setting data RSD3 and the fourth read setting data RSD4 may start from the fifth data unit.

As a result, as illustrated in FIG. 26, the first valid data units VA1, VA2 and VA4, the second valid data unit VB3, the third valid data units VC5~VC9 and the fourth valid data unit VD10 may be stored in the buffer 200 as the restored setting data RESSD.

Referring to FIG. 27, the first sensing operation SS1 and the second sensing operation SS2 may be performed simultaneously during a first sensing time tSS21 corresponding to a time interval T21~T22. During a first dump-down time tDD21 corresponding to a time interval T22~T23, the first enable signal EN1 and the second enable signal EN2 may be activated simultaneously, and the dump-down operation based on the first read setting data RSD1 and the second read setting data RSD2 may be performed as described with reference to FIG. 11. At the time point T23, it is determined that both of the first data unit A5 of the first read setting data RSD1 and the corresponding second data unit B5 are determined as invalid data units, and the dump-down operation based on the first read setting data RSD1 and the second read setting data RSD2 is determined as a failure.

The third sensing operation SS3 and the fourth sensing operation SS4 may be performed simultaneously during a second sensing time tSS22 corresponding to a time interval T23~T24. During a second dump-down time tDD22 corresponding to a time interval T24~T25, the first enable signal EN1 and the second enable signal EN2 may be activated simultaneously, and the dump-down operation based on the third read setting data RSD3 and the fourth read setting data RSD4 may be performed as described with reference to FIG. 11.

In this case, the buffer 200 may be reset, and the dump-down operation based on the third read setting data RSD3 and the fourth read setting data RSD4 may restart from the first data unit.

As a result, as illustrated in FIG. 27, the third valid data units VC1 and VC3~VC9 and the fourth valid data units VD2 and VD10 may be stored in the buffer 200 as the restored setting data RESSD.

Figure 28:
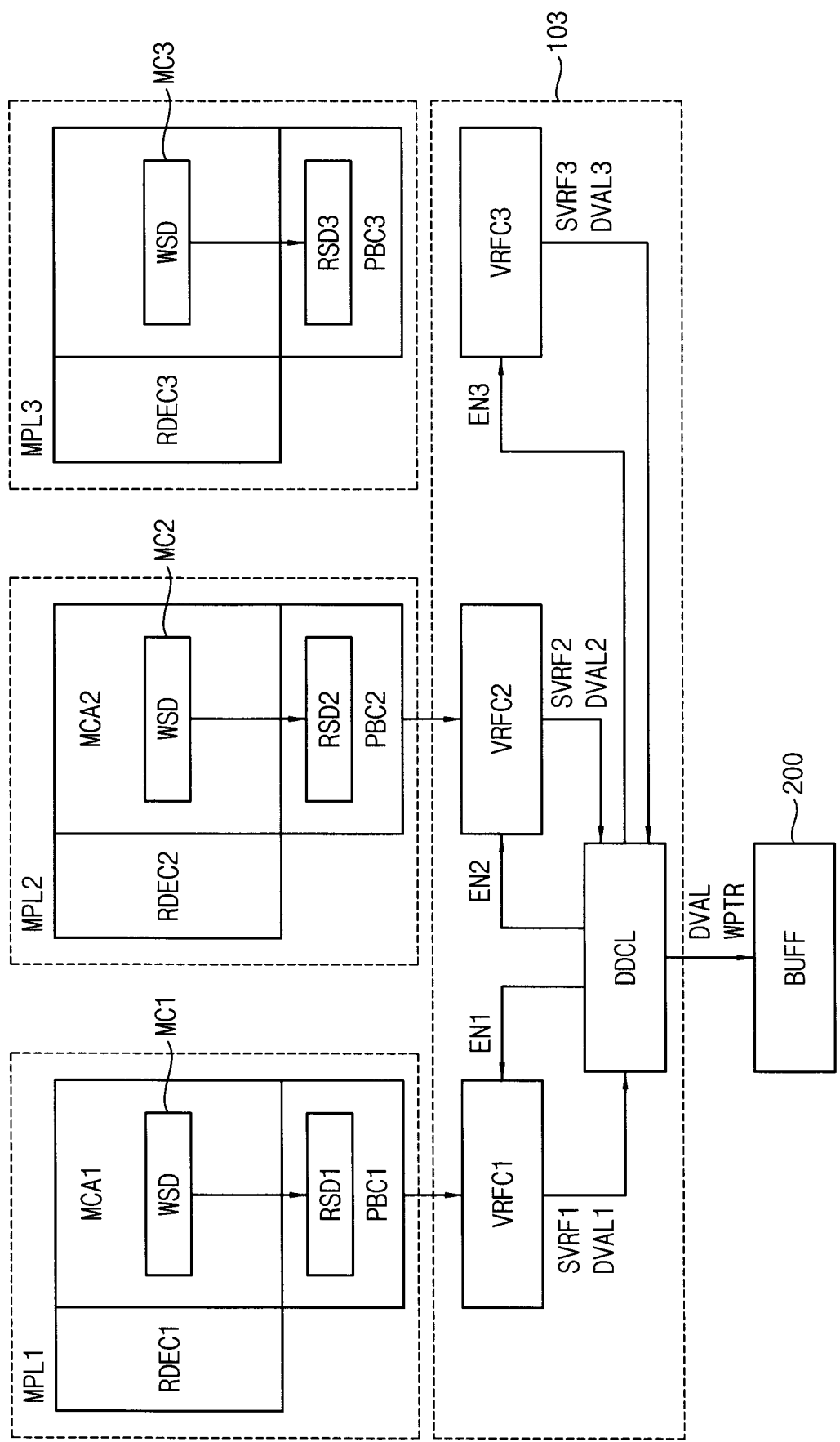
FIG. 28 is a diagram illustrating a nonvolatile memory device according to example embodiments.

FIG. 28 is a diagram illustrating a nonvolatile memory device according to example embodiments.

Referring to FIG. 28, a nonvolatile memory device 13 may include a first memory plane MPL1, a second memory plane MPL2, a third memory plane MPL3, a dump-down circuit 102 and a buffer 200. The nonvolatile memory device 13 of FIG. 28 is similar to the nonvolatile memory device 11 of FIG. 6, and the repeated descriptions are omitted for conciseness. The description that follows focuses mainly on the differences with the embodiment shown in FIG. 6.

The write setting data WSD may be stored in first memory cells MC1 of the first memory plane MPL1, second memory cells MC2 of the second memory plane MPL2, and third memory cells MC3 of the third memory plane MPL3. After that, a first sensing operation may be performed to sense the write setting data WSD stored in the first memory cells MC1 and store first read setting data RSD1 in the first page buffer circuit PBC1, a second sensing operation may be performed to sense the write setting data WSD stored in the second memory cells MC2 and store second read setting data RSD2 in the second page buffer circuit PBC2, and a third sensing operation may be performed to sense the write setting data WSD stored in the third memory cells MC3 and store third read setting data RSD3 in the third page buffer circuit PBC3. In some example embodiments, the third sensing operation may be performed if the dump-down operation based on the first read setting data RSD1 and the second read setting data RSD2 is determined as a failure.

The dump-down circuit 103 may include a first verification circuit VRFC1, a second verification circuit VRFC2, a third verification circuit VRFC3 and a dump-down control logic DDCL.

The first verification circuit VRFC1 is connected to the first page buffer circuit PBC1. The first verification circuit VRF1 may verify validity of the first read setting data RSD1 to provide a first verification signal SVRF1 and a first valid data DVAL1. The second verification circuit VRFC2 is connected to the second page buffer circuit PBC2. The second verification circuit VRFC2 may verify validity of the second read setting data RSD2 to provide a second verification signal SVRF2 and a second valid data DVAL2. The third verification circuit VRFC3 is connected to the third page buffer circuit PBC3. The third verification circuit VRFC3 may verify validity of the third read setting data RSD3 to provide a third verification signal SVRF3 and a third valid data DVAL3.

The dump-down control logic DDCL may determine a valid data DVAL corresponding one of the first read setting data RSD1, the second read setting data RSD2 and the third read setting data RSD3 based on a validity verification result of the first read setting data RSD1, a validity verification result of the second read setting data RSD2 and a validity verification result of the third read setting data RSD3 to store the valid data DVAL in the buffer 200.

The dump-down control logic DDCL may generate a first enable signal EN1, a second enable signal EN2 and a third enable signal EN3 based on the first verification signal SVRF1, the second verification signal SVRF2 and the third verification signal SVRF3. The first verification circuit VRFC1 may be enabled in response to activation of the first enable signal EN1, the second verification circuit VRFC2 may be enabled in response to activation of the second enable signal EN2, and the third verification circuit VRFC3 may be enabled in response to activation of the third enable signal EN3.

Figure 29:
FIG. 29 is a diagram illustrating an example of a read setting data sensed from a nonvolatile memory device according to example embodiments.

FIG. 29 is a diagram illustrating an example of a read setting data sensed from a nonvolatile memory device according to example embodiments. The descriptions repeated with FIG. 10 are omitted for conciseness.

In FIG. 29, an invalid data unit having uncorrectable errors may be represented to be hatched. FIG. 29 illustrates an example in which two first data units A3 and A5 of the first read setting data RSD1 are invalid data units, one second data unit B5 of the second read setting data RSD2 is an invalid data unit, and two third data units C2 and C10 of the third read setting data RSD3 are invalid data units.

Figure 30:
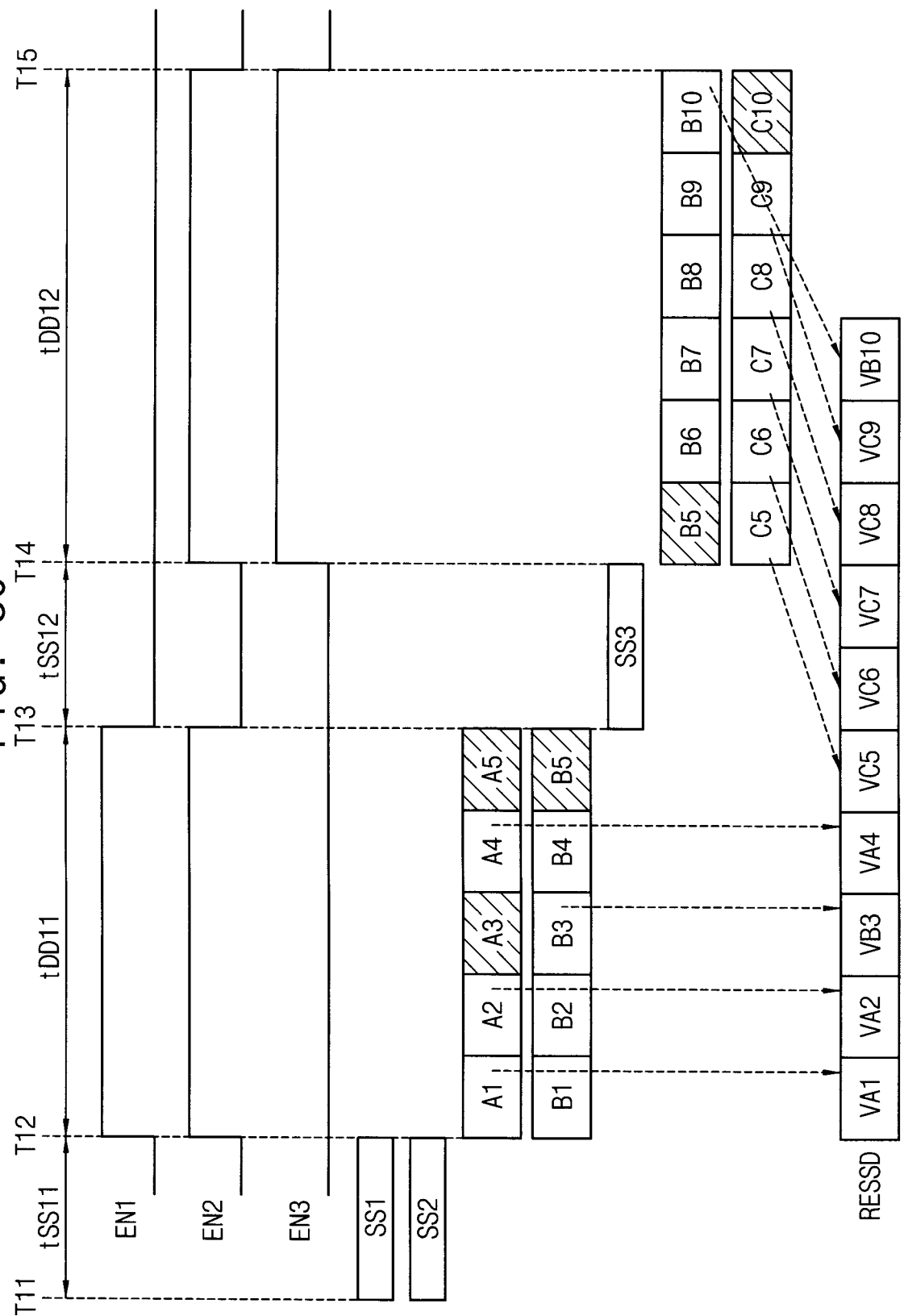
FIG. 30 is a diagram illustrating an example embodiment of a method of controlling initialization of a nonvolatile memory device corresponding to the read setting data of FIG. 29.

FIG. 30 is a diagram illustrating an example embodiment of a method of controlling initialization of a nonvolatile memory device corresponding to the read setting data of FIG. 29.

Referring to FIG. 30, the first sensing operation SS1 and the second sensing operation SS2 may be performed simultaneously during a first sensing time tSS11 corresponding to a time interval T11~T12. During a first dump-down time tDD11 corresponding to a time interval T12~T13, the first enable signal EN1 and the second enable signal EN2 may be activated simultaneously, and the dump-down operation based on the first read setting data RSD1 and the second read setting data RSD2 may be performed as described with reference to FIG. 11. At the time point T13, it is determined that both of the first data unit A5 of the first read setting data RSD1 and the corresponding second data unit B5 are determined as invalid data units, and the dump-down operation based on the first read setting data RSD1 and the second read setting data RSD2 is determined as a failure.

The third sensing operation SS3 may be performed simultaneously during a second sensing time tSS12 corresponding to a time interval T13~T14. During a second dump-down time tDD12 corresponding to a time interval T14~T15, the second enable signal EN2 and the third enable signal EN3 may be activated simultaneously, and the dump-down operation based on the second read setting data RSD2 and the third read setting data RSD3 may be performed as described with reference to FIG. 11.

In this case, the first valid data units VA1, VA2 and VA4 and the second valid data unit VB3 are stored already in the buffer 200, the dump-down operation based on the third read setting data RSD3 and the fourth read setting data RSD4 may start from the fifth data unit.

As a result, as illustrated in FIG. 30, the first valid data units VA1, VA2 and VA4, the second valid data units VB3 and VB10, and the third valid data units VC5~VC9 may be stored in the buffer 200 as the restored setting data RESSD.

Figure 31:
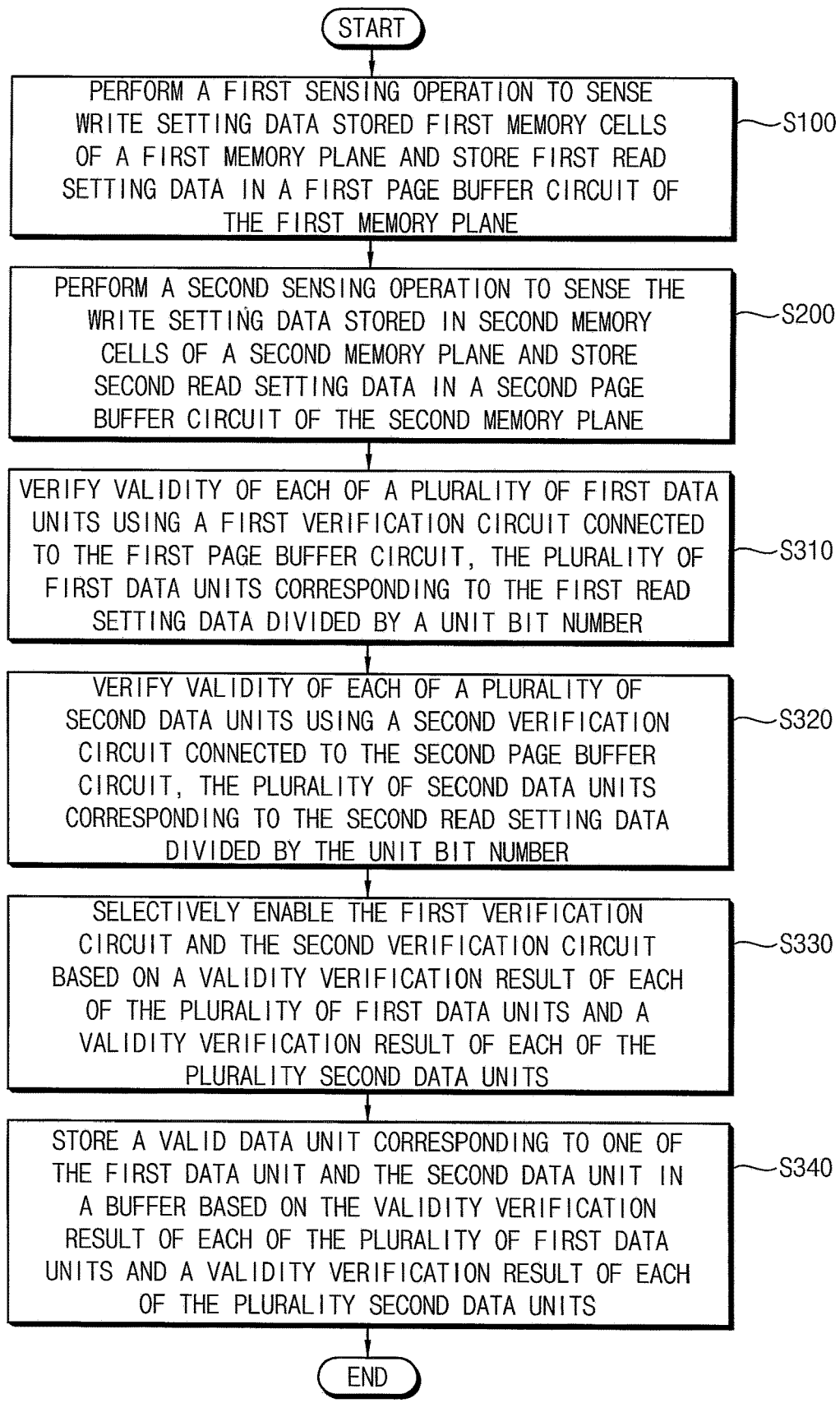
FIG. 31 is a flow chart illustrating a method of controlling initialization of a nonvolatile memory device according to example embodiments.

FIG. 31 is a flow chart illustrating a method of controlling initialization of a nonvolatile memory device according to example embodiments.

Referring to FIG. 31, a first sensing operation is performed to sense a write setting data stored in first memory cells of a first memory plane and store first read setting data in a first page buffer circuit of the first memory plane (S100). A second sensing operation is performed to sense the write setting data stored in second memory cells of a second memory plane and store second read setting data in a second page buffer circuit of the second memory plane (S200).

Validity of each of a plurality of first data units is verified using a first verification circuit connected to the first page buffer circuit, where the plurality of first data units correspond to the first read setting data divided by a unit bit number (S310). Validity of each of a plurality of second data units is verified using a second verification circuit connected to the second page buffer circuit, where the plurality of second data units correspond to the second read setting data divided by the unit bit number (S320).

The first verification circuit and the second verification circuit are enabled selectively based on a validity verification result of each of the plurality of first data units and a validity verification result of each of the plurality of second data units (S330).

A valid data unit corresponding to one of the first data unit and the second data unit is stored in a buffer based on the validity verification result of each of the plurality of first data units and the validity verification result of each of the plurality of second data units (S340)

Figure 32:
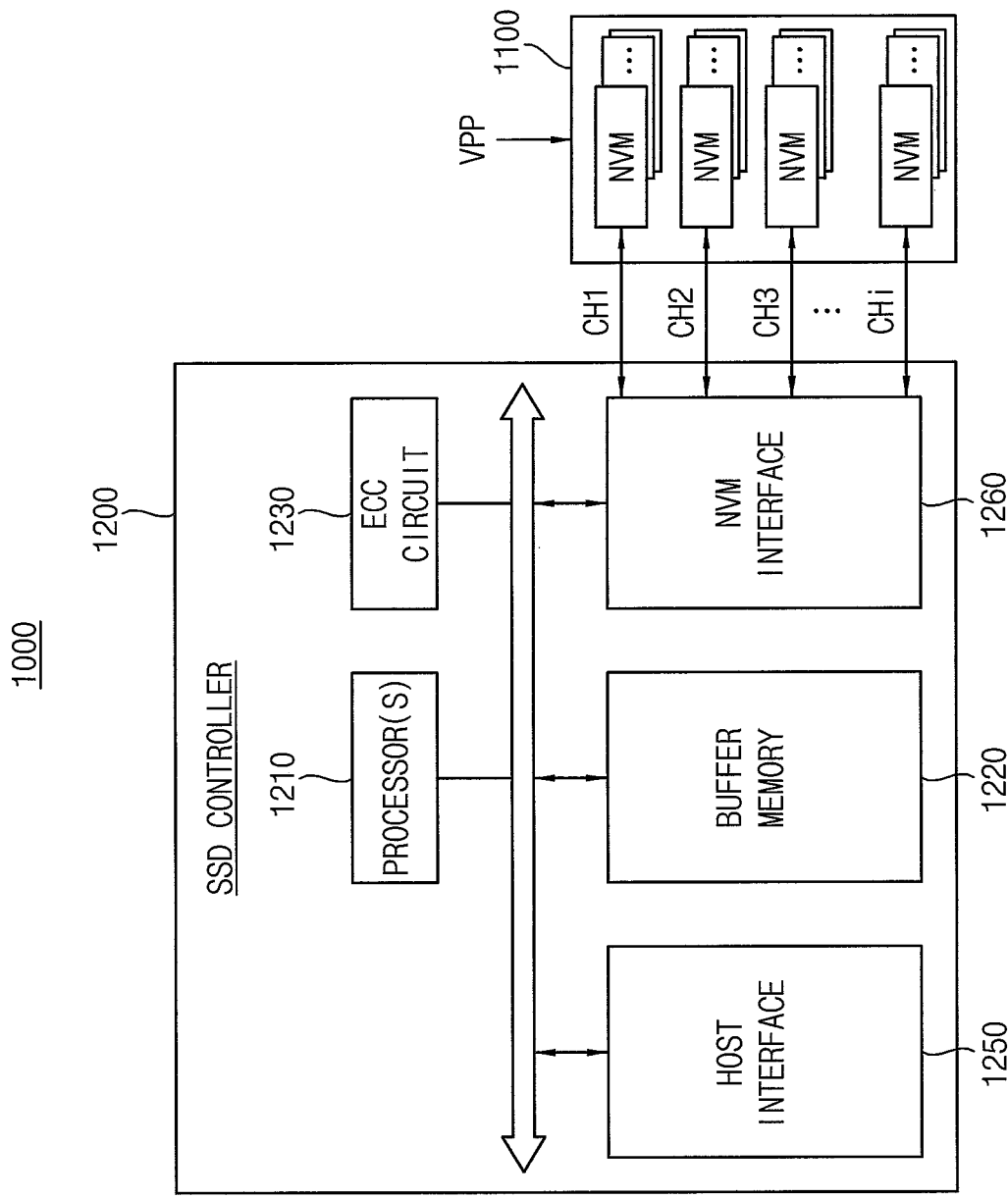
FIG. 32 is a block diagram illustrating a solid state disk or solid state drive (SSD) according to example embodiments.

FIG. 32 is a block diagram illustrating a solid state disk or solid state drive (SSD) according to example embodiments.

Referring to FIG. 32, an SSD 1000 includes multiple nonvolatile memory devices (NVM) 1100 and an SSD controller 1200.

The nonvolatile memory devices 1100 may be configured to receive a high voltage VPP. The nonvolatile memory devices 1100 may correspond to the above-described nonvolatile memory devices according to example embodiments. Thus, the nonvolatile memory devices 1100 may include a dump-down circuit as described above, and the dump-down circuit may include a plurality of verification circuits to implement a method of controlling initialization of a nonvolatile memory device The SSD controller 1200 is connected to the nonvolatile memory devices 1100 through multiple channels CH1 to CHi, respectively. The SSD controller 1200 includes one or more processors 1210, a buffer memory 1220, an error correction code (ECC) circuit 1230, a host interface 1250, and a nonvolatile memory interface 1260. The buffer memory 1220 stores data used to drive the SSD controller 1200. The buffer memory 1220 comprises multiple memory lines each storing data or a command. The ECC circuit 1230 calculates error correction code values of data to be programmed at a writing operation and corrects an error of read data using an error correction code value at a read operation. In a data recovery operation, the ECC circuit 1230 corrects an error of data recovered from the nonvolatile memory devices 1100.

Figure 33:
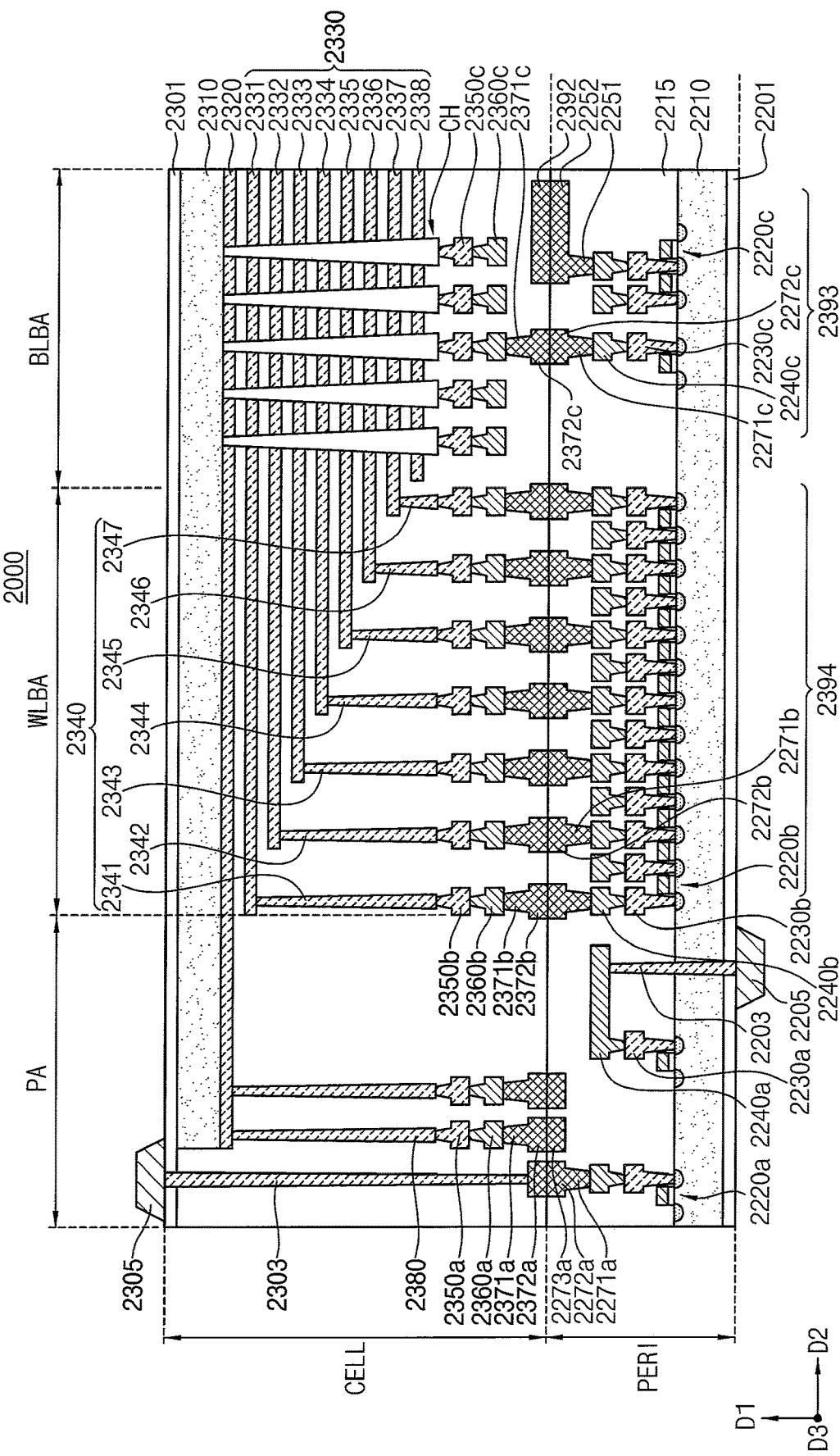
FIG. 33 is a cross-sectional view of a nonvolatile memory device according to example embodiments.

FIG. 33 is a cross-sectional view of a nonvolatile memory device according to example embodiments.

Referring to FIG. 33, a nonvolatile memory device or a memory device 2000 may have a chip-to-chip (C2C) structure. The C2C structure may refer to a structure formed by manufacturing an upper chip including a memory cell region or a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 2000 may include an external pad bonding area PA, a wordline bonding area WLBA, and a bitline bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high resistance, and the second metal layers 2240a, 2240b, and 2240c may be formed of copper having relatively low resistance.

In an example embodiment illustrated in FIG. 33, although the first metal layers 2230a, 2230b, and 2230c and the second metal layers 2240a, 2240b, and 2240c are shown and described, they are not limited thereto, and one or more metal layers may be further formed on the second metal layers 2240a, 2240b, and 2240c. At least a portion of the one or more metal layers formed on the second metal layers 2240a, 2240b, and 2240c may be formed of aluminum or the like having a lower resistance than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral circuit region PERI may be electrically connected to upper bonding metals 2371b and 2372b in the cell region CELL in a bonding manner, and the lower bonding metals 2271b and 2272b and the upper bonding metals 2371b and 2372b may be formed of aluminum, copper, tungsten, or the like. The upper bonding metals 2371b and 2372b in the cell region CELL may be referred as first metal pads and the lower bonding metals 2271b and 2272b in the peripheral circuit region PERI may be referred as second metal pads.

The cell region CELL may include at least one memory block. The cell region CELL may include a second substrate 2310 and a common source line 2320. On the second substrate 2310, a plurality of wordlines 2331, 2332, 2333, 2334, 2335, 2336, 2337, and 2338 (i.e., 2330) may be stacked in a first direction D1, perpendicular to an upper surface of the second substrate 2310. At least one string selection line and at least one ground selection line may be arranged on and below the plurality of wordlines 2330, respectively, and the plurality of wordlines 2330 may be disposed between the at least one string selection line and the at least one ground selection line.

In the bitline bonding area BLBA, a channel structure CH corresponding to a plurality of NAND strings may extend in the first direction D1, perpendicular to the upper surface of the second substrate 2310, and pass through the plurality of wordlines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bitline contact, and the second metal layer 2360c may be a bitline. In an example embodiment, the bitline 2360c may extend in a third direction D3, parallel to the upper surface of the second substrate 2310.

In an example embodiment illustrated in FIG. 33, an area in which the channel structure CH, the bitline 2360c, and the like are disposed may be defined as the bitline bonding area BLBA. In the bitline bonding area BLBA, the bitline 2360c may be electrically connected to the circuit elements 2220c providing a page buffer 2393 in the peripheral circuit region PERI. For example, the bitline 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393. The upper bonding metals 2371c and 2372c may be referred to as the first bonding metals and the lower bonding metals 2271c and 2272c may be referred to as the second bonding metals.

In the wordline bonding area WLBA, the plurality of wordlines 2330 may extend in a second direction D2, parallel to the upper surface of the second substrate 2310, and may be connected to a plurality of cell contact plugs 2341, 2342, 2343, 2344, 2345, 2346, and 2347 (i.e., 2340). The plurality of wordlines 2330 and the plurality of cell contact plugs 2340 may be connected to each other in pads provided by at least a portion of the plurality of wordlines 2330 extending in different lengths in the second direction D2. A first metal layer 2350b and a second metal layer 2360b may be connected to an upper portion of the plurality of cell contact plugs 2340 connected to the plurality of wordlines 2330, sequentially. The plurality of cell contact plugs 2340 may be connected to the circuit region PERI by the upper bonding metals 2371b and 2372b of the cell region CELL and the lower bonding metals 2271b and 2272b of the peripheral circuit region PERI in the wordline bonding area WLBA.

The plurality of cell contact plugs 2340 may be electrically connected to the circuit elements 2220b providing a row decoder 2394 in the peripheral circuit region PERI. In an example embodiment, operating voltages of the circuit elements 2220b providing the row decoder 2394 may be different than operating voltages of the circuit elements 2220c providing the page buffer 2393. For example, operating voltages of the circuit elements 2220c providing the page buffer 2393 may be greater than operating voltages of the circuit elements 2220b providing the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310, and a second input/output pad 2305 may be disposed on the upper insulating layer 2301. The second input/output pad 2305 may be connected to at least one of the plurality of circuit elements 2220a, 2220b, and 2220c disposed in the peripheral circuit region PERI through a second input/output contact plug 2303.

According to embodiments, the second substrate 2310 and the common source line 2320 may not be disposed in an area in which the second input/output contact plug 2303 is disposed. Also, the second input/output pad 2305 may not overlap the wordlines 2330 in the first direction D1. The second input/output contact plug 2303 may be separated from the second substrate 2310 in the direction, parallel to the upper surface of the second substrate 310, and may pass through the interlayer insulating layer 2315 of the cell region CELL to be connected to the second input/output pad 2305.

According to embodiments, the first input/output pad 2205 and the second input/output pad 2305 may be selectively formed. For example, the memory device 2000 may include only the first input/output pad 2205 disposed on the first substrate 2210 or the second input/output pad 2305 disposed on the second substrate 2310. Alternatively, the memory device 200 may include both the first input/output pad 2205 and the second input/output pad 2305.

A metal pattern in an uppermost metal layer may be provided as a dummy pattern or the uppermost metal layer may be absent, in each of the external pad bonding area PA and the bitline bonding area BLBA, respectively included in the cell region CELL and the peripheral circuit region PERI.

In the external pad bonding area PA, the nonvolatile memory device 2000 may include a lower metal pattern 2273a, corresponding to an upper metal pattern 2372a formed in an uppermost metal layer of the cell region CELL, and having the same shape as the upper metal pattern 2372a of the cell region CELL, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2271b and 2272b may be formed on the second metal layer 2240b in the wordline bonding area WLBA. In the wordline bonding area WLBA, the lower bonding metals 2271b and 2272b of the peripheral circuit region PERI may be electrically connected to the upper bonding metals 2371b and 2372b of the cell region CELL by a Cu—Cu bonding.

Further, the bitline bonding area BLBA, an upper metal pattern 2392, corresponding to a lower metal pattern 2252 formed in the uppermost metal layer of the peripheral circuit region PERI, and having the same shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

As described above, the nonvolatile memory device 2000 may include a plurality of memory planes, and each memory plane may include memory cells and a page buffer circuit. The memory cells may be vertically stacked in the NAND strings CH and the memory cells may be coupled to page buffers 2390 thought the bitlines 2360c. First memory cells may be formed in the memory cell region CELL of a first memory plane and second memory cells may be formed in the memory cell region CELL of a second memory plane. In addition, a first page buffer circuit may be formed in the peripheral circuit region PERI of the first memory plane and a second page buffer circuit may be formed in the peripheral circuit region PERI of the second memory plane. A dump-down circuit to perform the method of controlling initialization of the nonvolatile memory device 2000 as described above may be formed in the peripheral circuit region PERI.

The inventive concept according to the various example embodiments described above may be applied to any electronic devices and systems. For example, the inventive concept may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A method of controlling initialization of a nonvolatile memory device, the nonvolatile memory device comprising a memory cell region including a first metal pad and a peripheral circuit region including a second metal pad and vertically connected to the memory cell region by the first metal pad and the second metal pad, the method comprising:
    performing a first sensing operation to sense a write setting data stored in first memory cells in the memory cell region of a first memory plane and store first read setting data in a first page buffer circuit in the peripheral circuit region of the first memory plane;
    performing a second sensing operation to sense the write setting data stored in second memory cells in the memory cell region of a second memory plane and store second read setting data in a second page buffer circuit in the peripheral circuit region of the second memory plane; and
    performing a dump-down operation to store restored setting data corresponding to the write setting data in a buffer based on validity of the first read setting data and the second read setting data.

2. The method of claim 1, wherein performing the dump-down operation includes:
verifying validity of the first read setting data using a first verification circuit connected to the first page buffer circuit;
verifying validity of the second read setting data using a second verification circuit connected to the second page buffer circuit; and
storing valid data corresponding to one of a first data unit and a second data unit in the buffer based on a validity verification result of the first read setting data and a validity verification result of the second read setting data.

3. The method of claim 2, wherein verifying validity of the first read setting data includes:
verifying validity of each of a plurality of first data units corresponding to the first read setting data divided by a unit bit number, and
wherein verifying validity of the second read setting data includes:
verifying validity of each of a plurality of second data units corresponding to the second read setting data divided by the unit bit number.

4. The method of claim 3, wherein storing the valid data includes:
sequentially storing first valid data units in the buffer based on the plurality of first data units before one of the plurality of first data units is determined as an invalid data unit; and
sequentially storing second valid data units in the buffer based on the plurality of second data units starting from a second data unit corresponding to the one of the plurality of first data units determined as the invalid data unit.

5. The method of claim 4, wherein the first verification circuit is enabled to verify validity of the first data units and the second verification circuit is disabled before the one of the plurality of first data units is determined as the invalid data unit, and the first verification circuit is disabled and the second verification circuit is enabled to verify validity of the second data units after the one of the plurality of first data units is determined as the invalid data unit.

6. The method of claim 4, wherein, when the second sensing operation is not completed at a time point when the one of the plurality of first data units is determined as the invalid data unit, both of the first verification circuit and the second verification circuit are disabled until the second sensing operation is completed.

7. The method of claim 4, wherein storing the valid data further includes:
sequentially storing the second valid data units in the buffer based on the plurality of second data units before one of the plurality of second data units is determined as an invalid data unit; and
sequentially storing first valid data units in the buffer based on the plurality of first data units starting from a first data unit corresponding to the one of the plurality of second data units determined as the invalid data unit.

8. The method of claim 3, wherein storing the valid data includes:
sequentially storing first valid data units based on the first data units determined as valid data units; and
sequentially storing second valid data units based on the second data units corresponding to the first data units determined as invalid data units.

9. The method of claim 8, wherein the first verification circuit and the second verification circuit are enabled simultaneously such that the dump-down operation with respect to the first valid data units and the dump-down operation with respect to the second valid data units are performed alternatively.

10. The method of claim 8, wherein the first verification circuit is enabled first and the second verification circuit is enabled after the first verification circuit is disabled such that the dump-down operation with respect to the second valid data units is performed after the dump-down operation with respect to the first valid data units is completed.

11. The method of claim 1, wherein the first sensing operation and the second sensing operation start simultaneously such that the first sensing operation and the second sensing operation are completed simultaneously.

12. The method of claim 1, wherein the first sensing operation starts in advance before the second sensing operation starts such that a completion time point of the first sensing operation precedes a completion time point of the second sensing operation.

13. The method of claim 1, wherein the dump-down operation starts at a completion time point of the second sensing operation.

14. The method of claim 1, wherein the dump-down operation starts at a completion time point of the first sensing operation.

15. A method of controlling initialization of a nonvolatile memory device, the nonvolatile memory device comprising a memory cell region including a first metal pad and a peripheral circuit region including a second metal pad and vertically connected to the memory cell region by the first metal pad and the second metal pad, the method comprising:
performing a first sensing operation to sense a write setting data stored in first memory cells in the memory cell region of a first memory plane and store first read setting data in a first page buffer circuit in the peripheral circuit region of the first memory plane;
performing a second sensing operation to sense the write setting data stored in second memory cells in the memory cell region of a second memory plane and store second read setting data in a second page buffer circuit in the peripheral circuit region of the second memory plane;
verifying validity of each of a plurality of first data units using a first verification circuit connected to the first page buffer circuit, the plurality of first data units corresponding to the first read setting data divided by a unit bit number;
verifying validity of each of a plurality of second data units using a second verification circuit connected to the second page buffer circuit, the plurality of second data units corresponding to the second read setting data divided by the unit bit number;
selectively enabling the first verification circuit and the second verification circuit based on a validity verification result of each of the plurality of first data units and a validity verification result of each of the plurality of second data units; and
storing a valid data unit corresponding to one of a first data unit and a second data unit in a buffer based on the validity verification result of each of the plurality of first data units and the validity verification result of each of the plurality of second data units.

16. A nonvolatile memory device comprising:
a memory cell region including a first metal pad;

a peripheral circuit region including a second metal pad and vertically connected to the memory cell region by the first metal pad and the second metal pad;

a first memory plane including first memory cells in the memory cell region storing write setting data and a first page buffer circuit in the peripheral circuit region storing first read setting data sensed from the first memory cells;

a second memory plane including second memory cells in the memory cell region storing the write setting data and a second page buffer circuit in the peripheral circuit region storing second read setting data sensed from the second memory cells;

a first verification circuit connected to the first page buffer circuit, the first verification circuit configured to verify validity of the first read setting data;

a second verification circuit connected to the second page buffer circuit, the second verification circuit configured to verify validity of the second read setting data;

a dump-down control logic configured to determine valid data corresponding to one of the first read setting data and the second read setting data based on a validity verification result of the first read setting data and a validity verification result of the second read setting data; and a buffer configured to store the valid data provided from the dump-down control logic.

17. The nonvolatile memory device of claim 16, wherein the nonvolatile memory device is a vertical NAND flash memory device such that each of the first memory plane and the second memory plane includes NAND flash memory cells stacked in a vertical direction to form cell strings.

18. The nonvolatile memory device of claim 16, wherein the first metal pad and the second metal pad are formed of copper.

19. The nonvolatile memory device of claim 16, wherein the first metal pad and the second metal pad are connected by bonding manner.

20. The nonvolatile memory device of claim 16, wherein the memory cell region is formed on a first wafer and the peripheral circuit region is formed on a second wafer.

* * * * *